(12) United States Patent
Komuro et al.

(10) Patent No.: US 12,119,349 B2
(45) Date of Patent: Oct. 15, 2024

(54) SEMICONDUCTOR INTEGRATED CIRCUIT DEVICE

(71) Applicant: SOCIONEXT INC., Kanagawa (JP)

(72) Inventors: Hideyuki Komuro, Yokohama (JP);
Tomoya Tsuruta, Yokohama (JP);
Yasuhiro Nakaoka, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 594 days.

(21) Appl. No.: 17/404,639

(22) Filed: Aug. 17, 2021

(65) Prior Publication Data

US 2021/0375863 A1 Dec. 2, 2021

Related U.S. Application Data

(63) Continuation of application No. PCT/JP2020/002569, filed on Jan. 24, 2020.

(30) Foreign Application Priority Data

Feb. 18, 2019 (JP) .................................. 2019-026605

(51) Int. Cl.
*H01L 27/092* (2006.01)
*H01L 21/8238* (2006.01)
*H01L 27/02* (2006.01)
*H01L 27/06* (2006.01)
*H01L 27/118* (2006.01)

(52) U.S. Cl.
CPC .... *H01L 27/092* (2013.01); *H01L 21/823871* (2013.01); *H01L 27/0207* (2013.01); *H01L 27/0688* (2013.01); *H01L 27/11807* (2013.01)

(58) Field of Classification Search
CPC ........... H01L 27/092; H01L 21/823871; H01L 27/0207; H01L 27/0688; H01L 27/11807
See application file for complete search history.

(56) References Cited

U.S. PATENT DOCUMENTS

| | | |
|---|---|---|
| 2006/0289940 A1 | 12/2006 | Hyun et al. |
| 2012/0138886 A1 | 6/2012 | Kuhn et al. |
| 2014/0326952 A1 | 11/2014 | Kuhn et al. |
| 2015/0303258 A1 | 10/2015 | Kuhn et al. |
| 2016/0172360 A1 | 6/2016 | Shimbo |

(Continued)

FOREIGN PATENT DOCUMENTS

| | | |
|---|---|---|
| JP | 2007-013156 A | 1/2007 |
| JP | 2014-505995 A | 3/2014 |

(Continued)

OTHER PUBLICATIONS

International Search Report issued in International Patent Application No. PCT/JP2020/002569, dated Mar. 24, 2020; with English translation.

(Continued)

*Primary Examiner* — Walter H Swanson
(74) *Attorney, Agent, or Firm* — Rimon P.C.

(57) ABSTRACT

A cell row includes an inverter cell having a logic function and a termination cell having no logic function. The termination cell is arranged at one of two ends of the cell row. A gate line and dummy gate lines are arranged in the same layer in a Z direction. Local interconnects are arranged in the same layer in the Z direction. Local interconnects are arranged in the same layer in the Z direction.

5 Claims, 16 Drawing Sheets

(56) References Cited

U.S. PATENT DOCUMENTS

| | | |
|---|---|---|
| 2016/0190138 A1 | 6/2016 | Shimbo |
| 2017/0133462 A1 | 5/2017 | Kuhn et al. |
| 2018/0097004 A1 | 4/2018 | Shimbo |
| 2018/0130799 A1 | 5/2018 | Shimbo |
| 2019/0109133 A1 | 4/2019 | Shimbo |
| 2019/0123063 A1 | 4/2019 | Hino et al. |
| 2019/0148380 A1 | 5/2019 | Shimbo |
| 2019/0164993 A1 | 5/2019 | Shimbo |
| 2019/0172841 A1 | 6/2019 | Kishishita |
| 2020/0219970 A1* | 7/2020 | Mannebach ...... H01L 29/66795 |
| 2020/0227520 A1 | 7/2020 | Kuhn et al. |
| 2020/0235099 A1 | 7/2020 | Shimbo |
| 2020/0286918 A1 | 9/2020 | Hino et al. |
| 2021/0013201 A1 | 1/2021 | Shimbo |
| 2021/0104552 A1 | 4/2021 | Shimbo |

FOREIGN PATENT DOCUMENTS

| | | |
|---|---|---|
| WO | 2015/025441 A1 | 2/2015 |
| WO | 2015/033490 A1 | 3/2015 |
| WO | 2018/003634 A1 | 1/2018 |
| WO | 2018/025580 A1 | 2/2018 |
| WO | 2018/030107 A1 | 2/2018 |

OTHER PUBLICATIONS

Ryckaert J. et al., "The Complementary FET (CFET) for CMOS scaling beyond N3", 2018 IEEE Symposium on VLSI Technology Digest of Technical Papers, pp. 141-142.

A. Mocuta et al., "Enabling CMOS Scaling Towards 3nm andBeyond", 2018 IEEE Symposium on VLSI Technology Digest of Technical Papers; pp. 147-148.

* cited by examiner

FIG.2
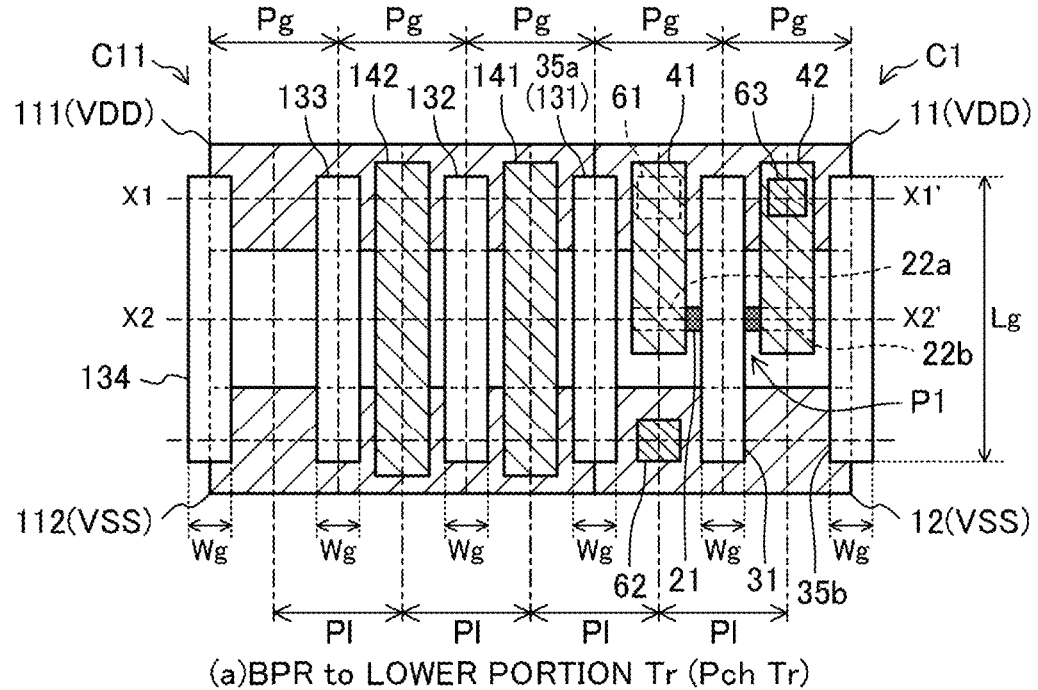
(a) BPR to LOWER PORTION Tr (Pch Tr)
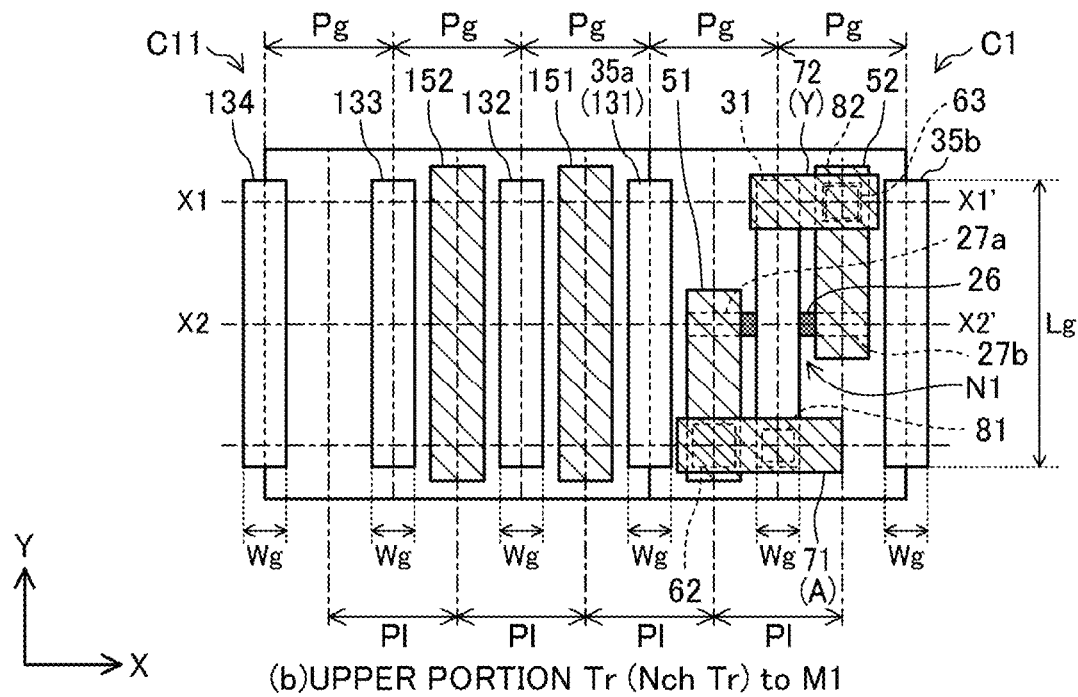
(b) UPPER PORTION Tr (Nch Tr) to M1
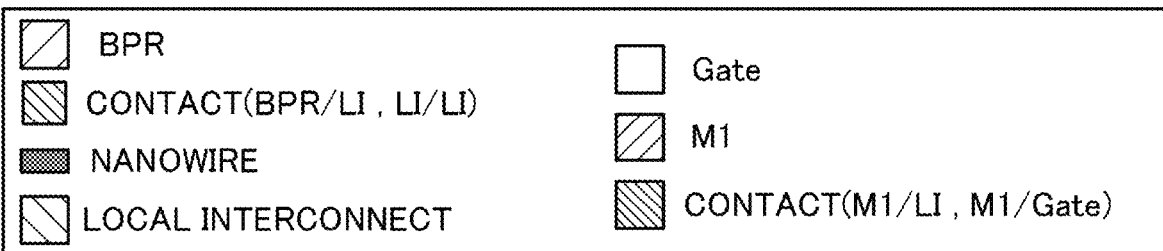

FIG.3
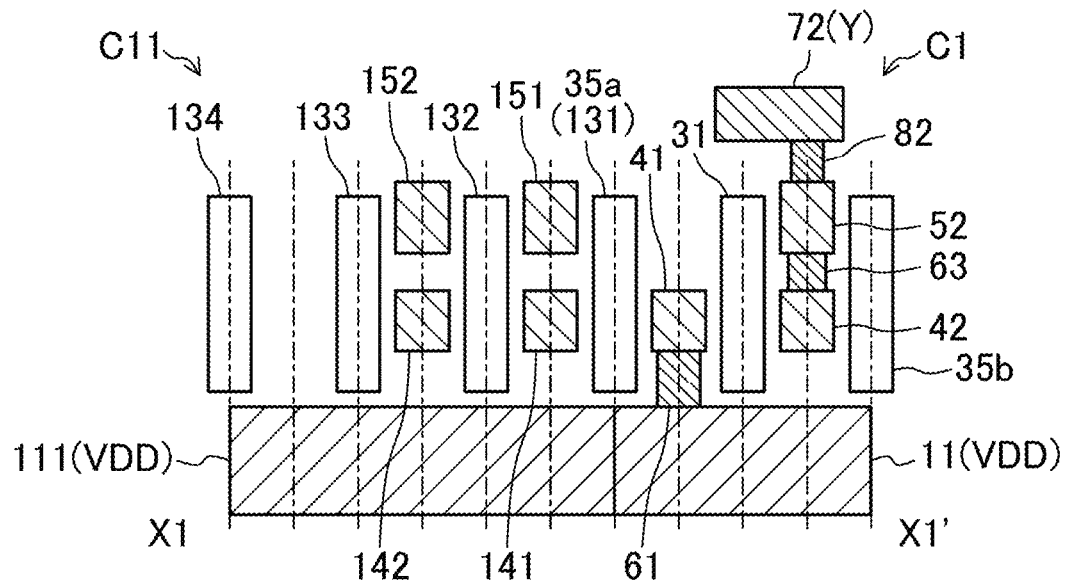
(a) CROSS-SECTIONAL VIEW TAKEN ALONG X1-X'1
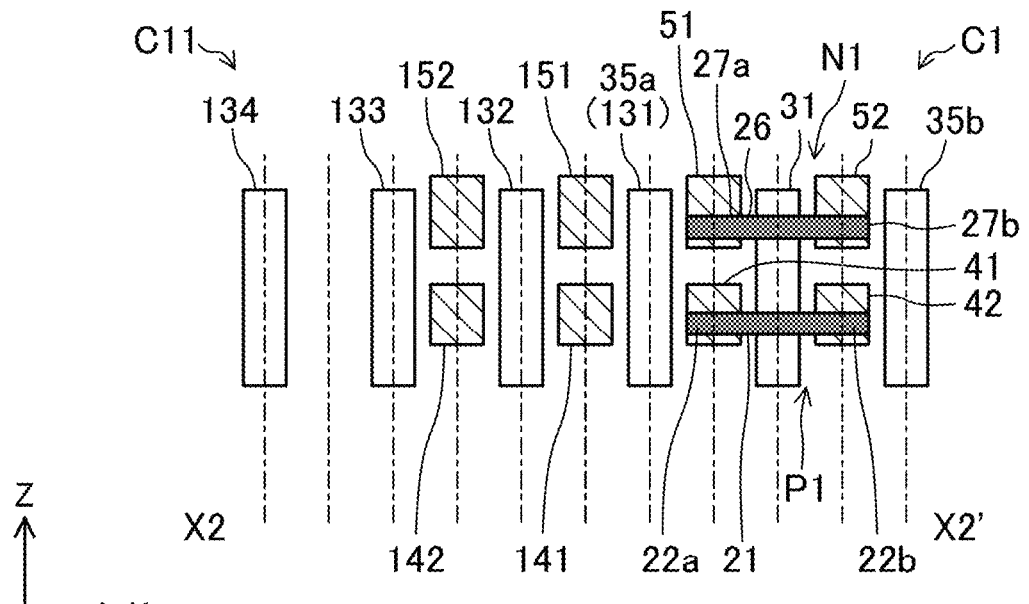
(b) CROSS-SECTIONAL VIEW TAKEN ALONG X2-X'2
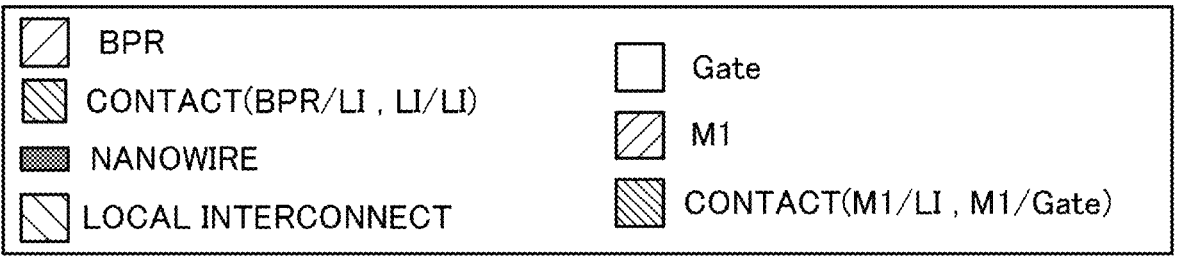

FIG.5
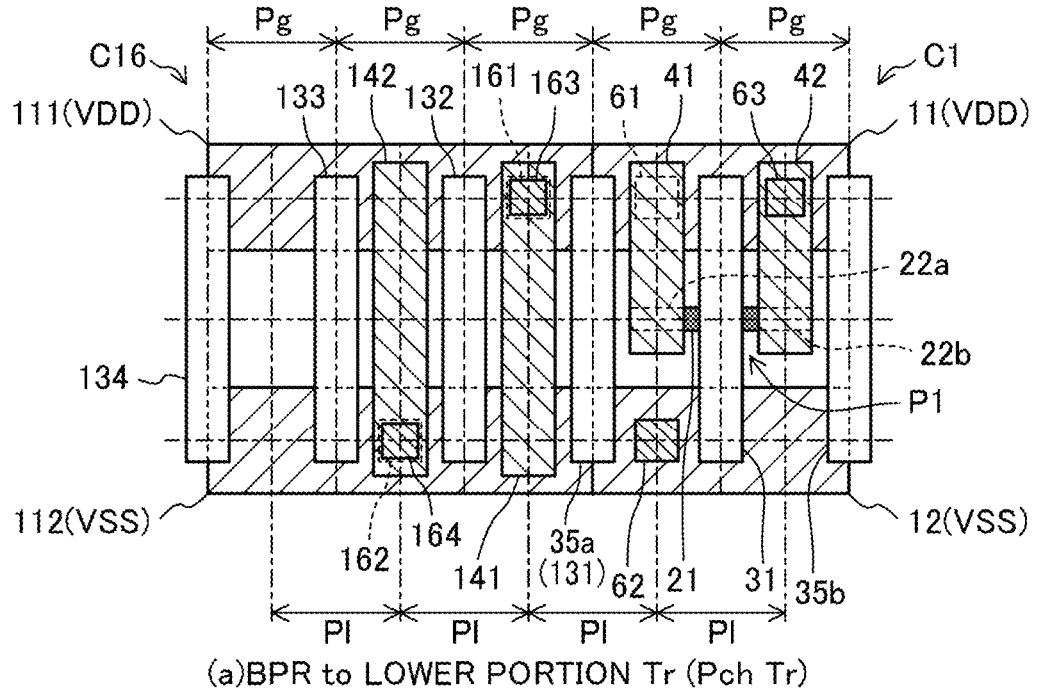
(a) BPR to LOWER PORTION Tr (Pch Tr)
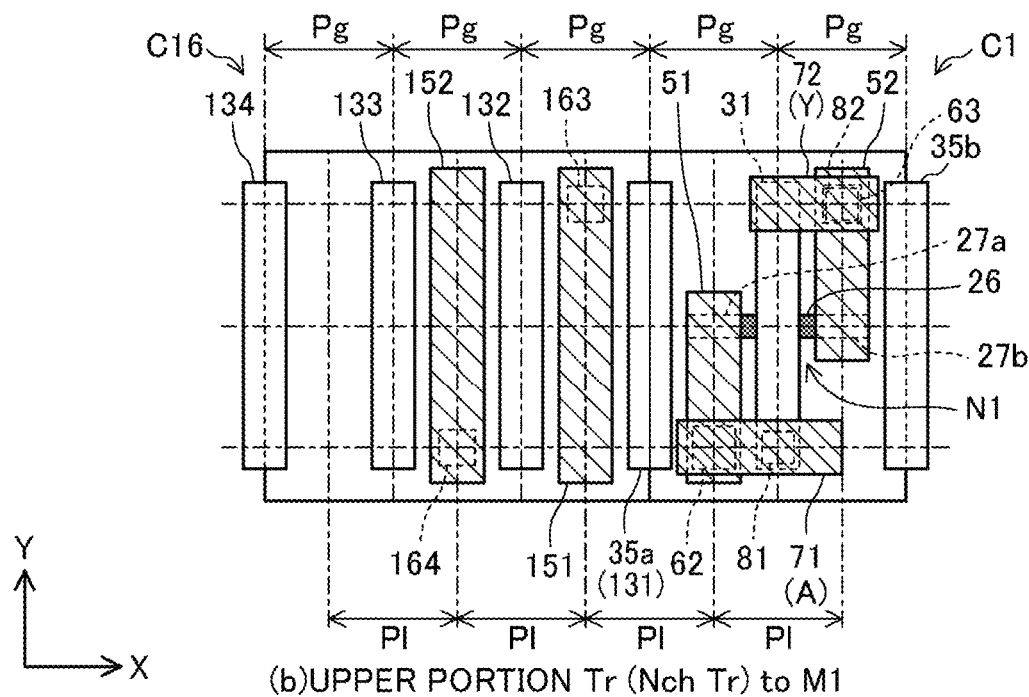
(b) UPPER PORTION Tr (Nch Tr) to M1
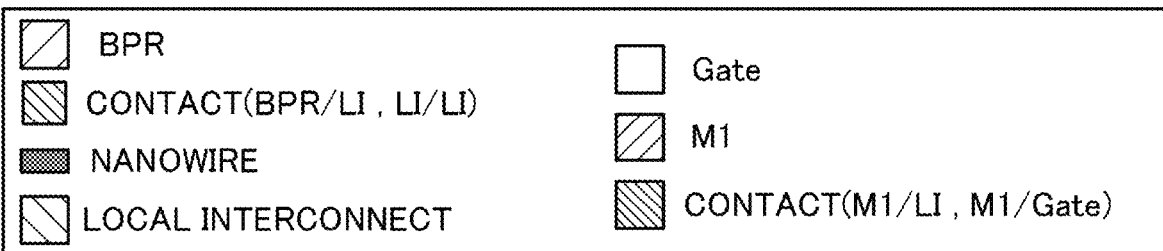

FIG.7
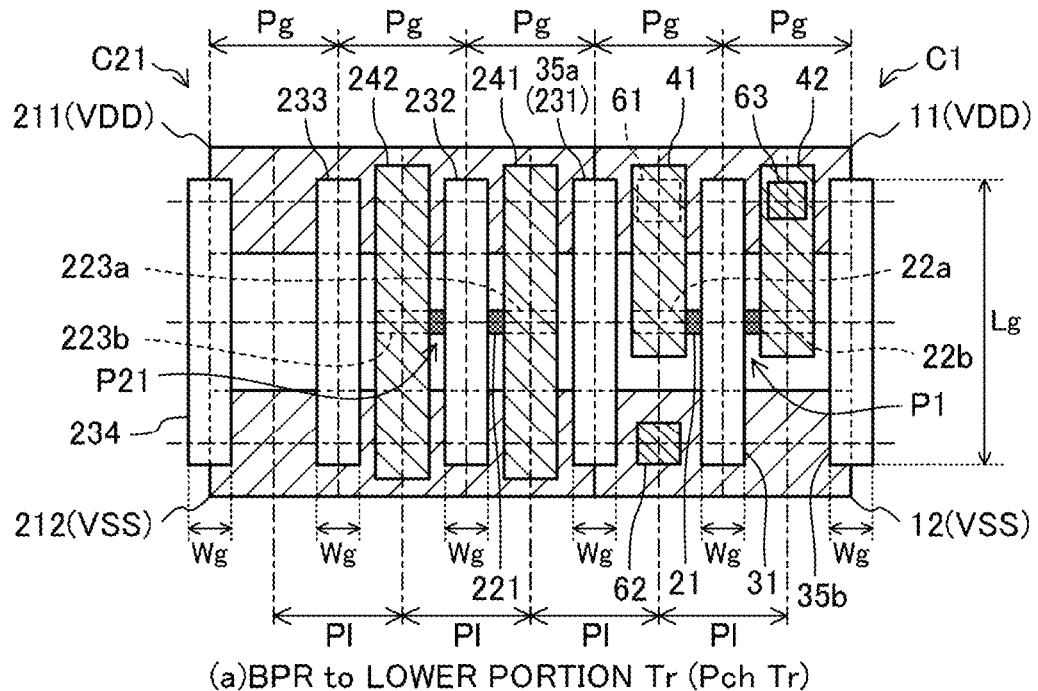
(a) BPR to LOWER PORTION Tr (Pch Tr)
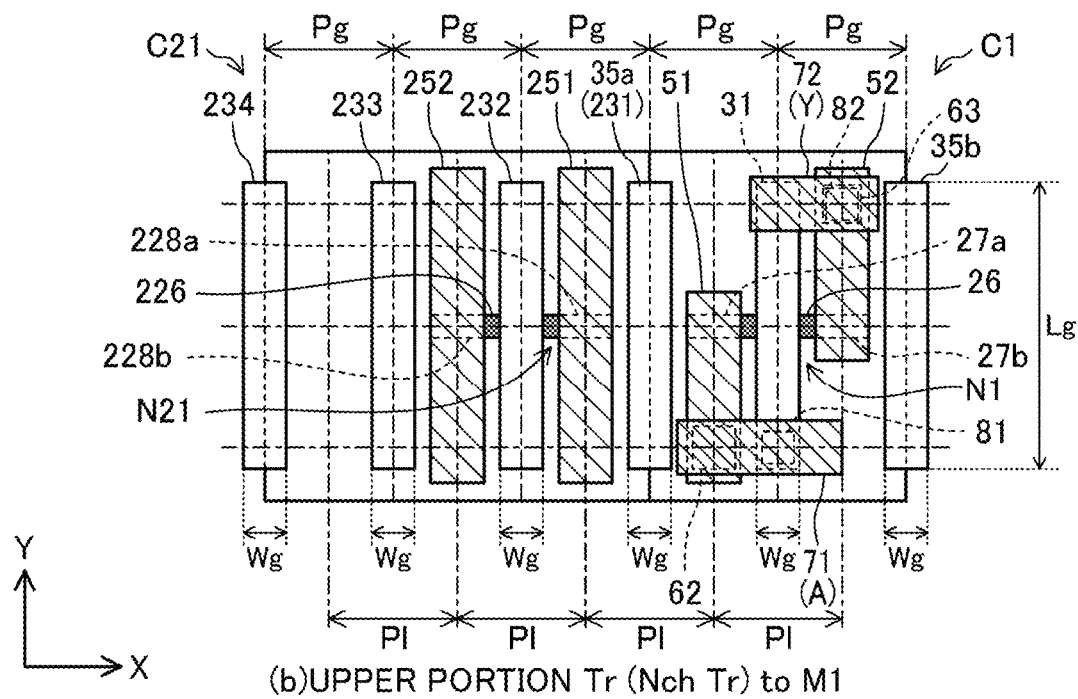
(b) UPPER PORTION Tr (Nch Tr) to M1
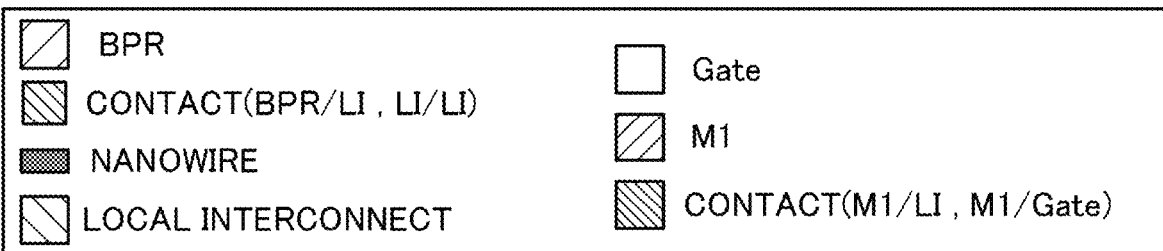

FIG.9
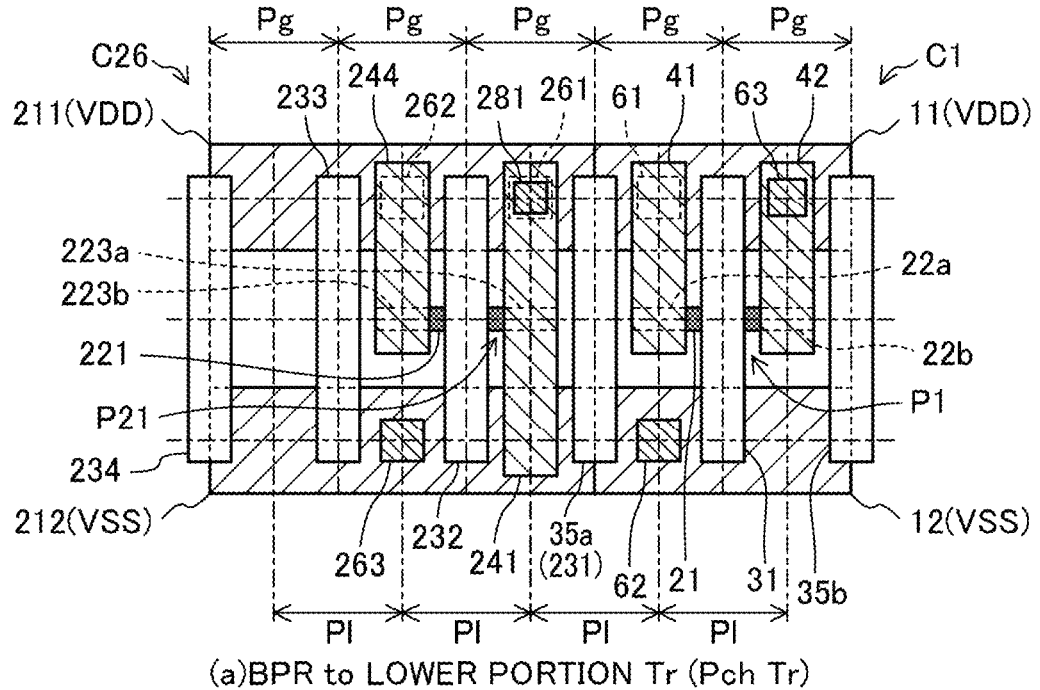
(a) BPR to LOWER PORTION Tr (Pch Tr)
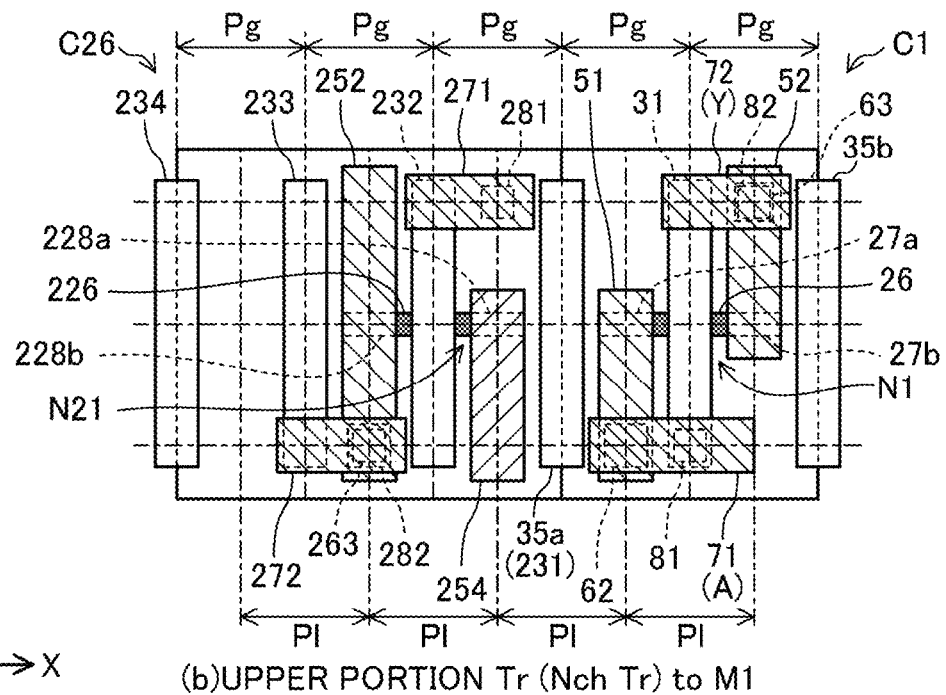
(b) UPPER PORTION Tr (Nch Tr) to M1
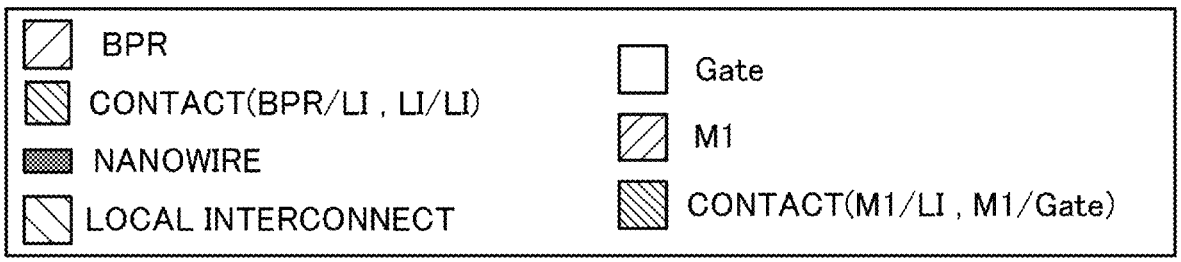

FIG.10
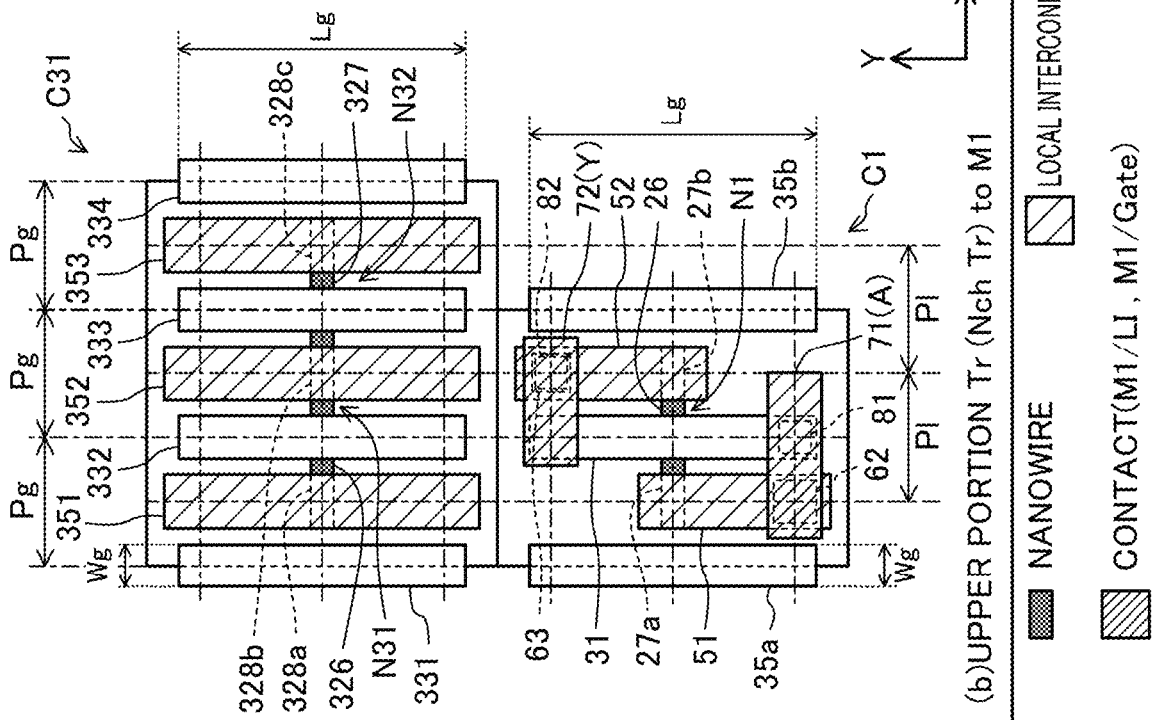
(a) BPR to LOWER PORTION Tr (Pch Tr)
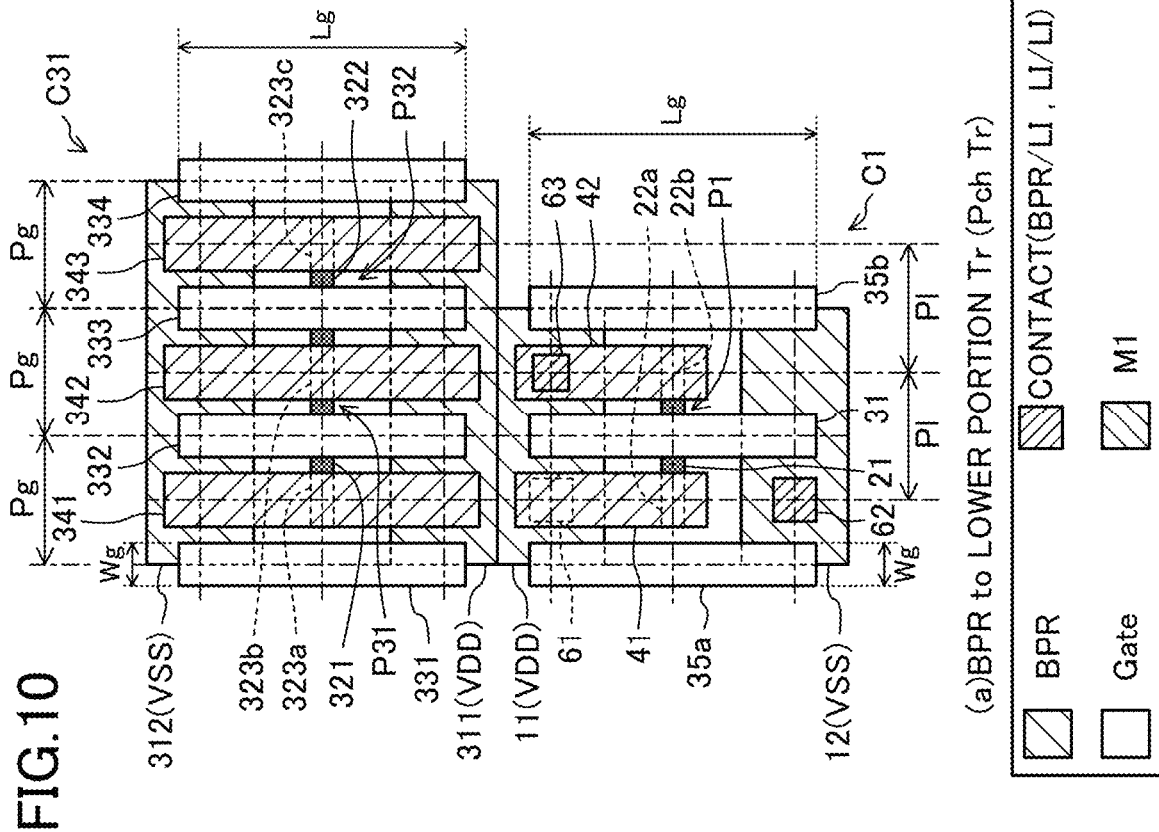
(b) UPPER PORTION Tr (Nch Tr) to M1

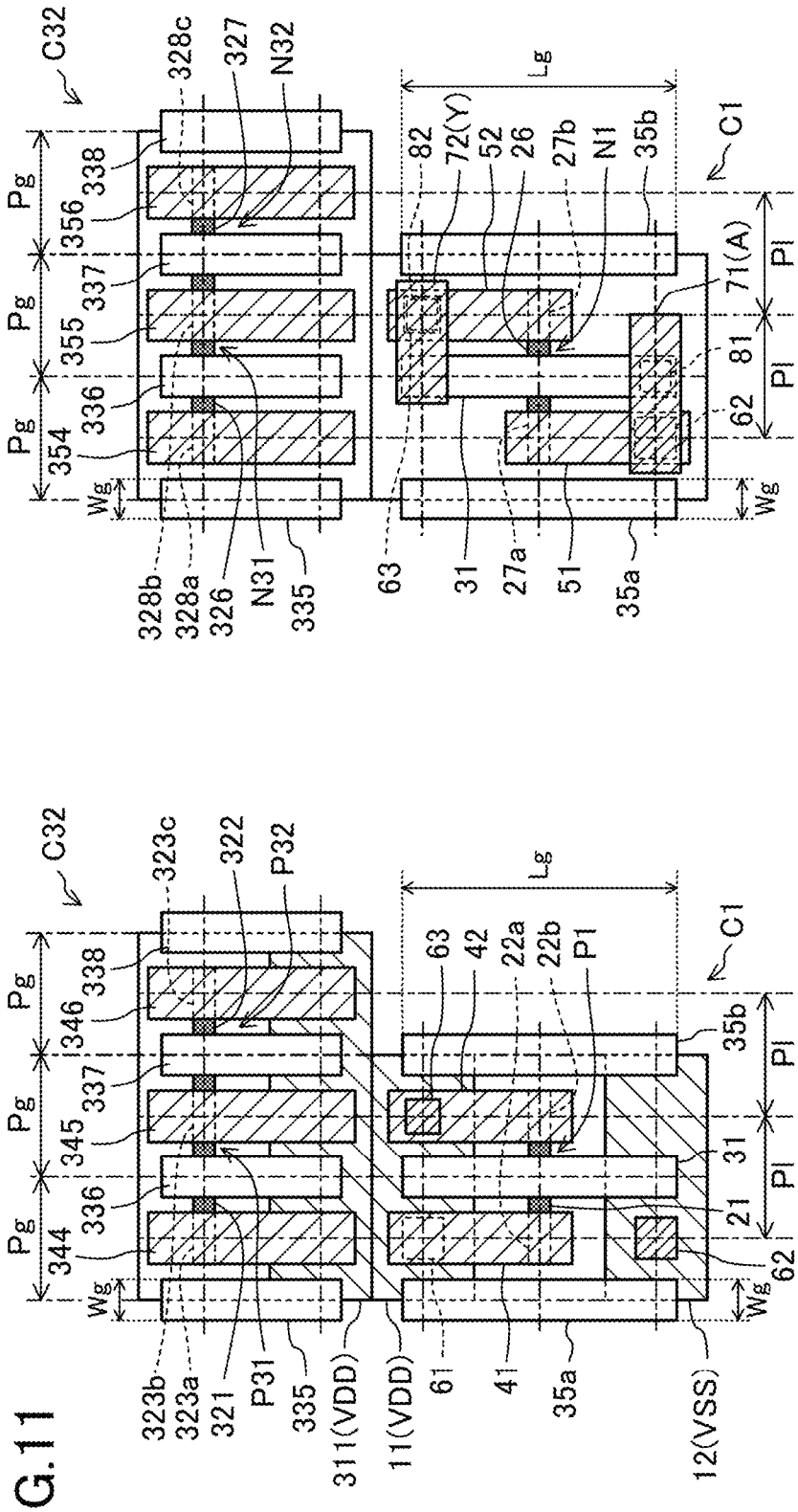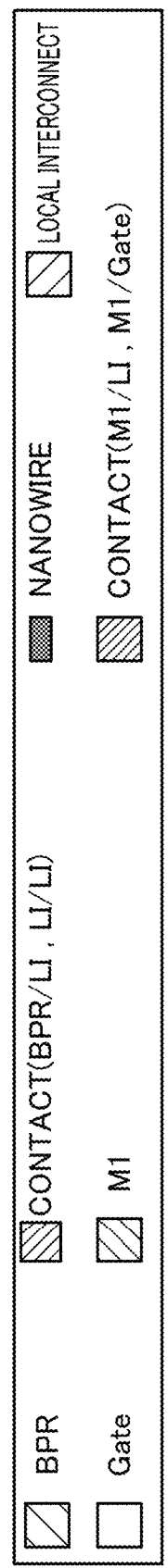
FIG.11

FIG.12
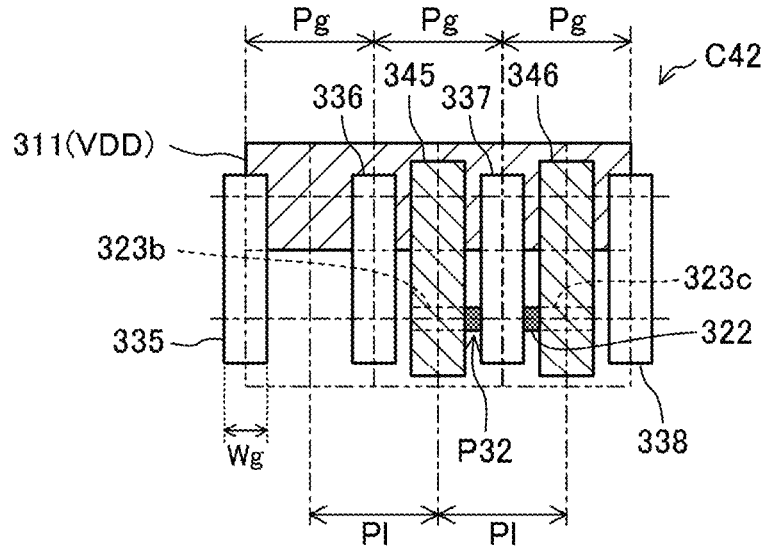
(a) BPR to LOWER PORTION Tr (Pch Tr)
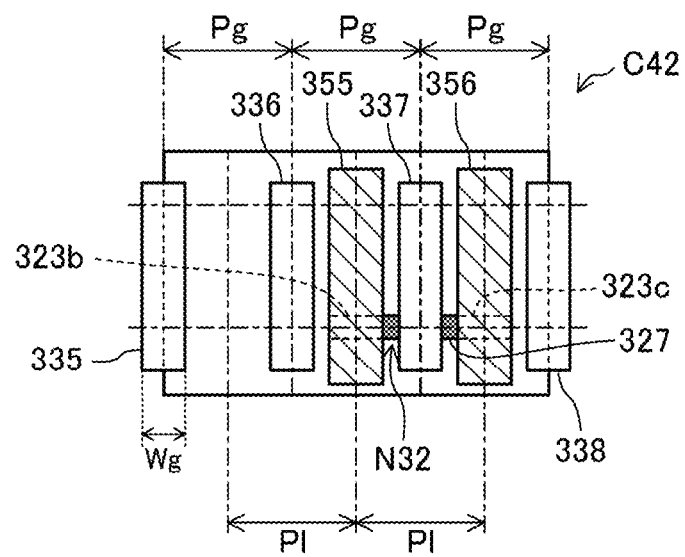
(b) UPPER PORTION Tr (Nch Tr) to M1
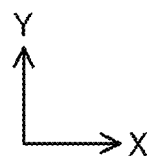
| | BPR | | Gate |
|---|---|---|---|
| | CONTACT(BPR/LI, LI/LI) | | M1 |
| | NANOWIRE | | CONTACT(M1/LI, M1/Gate) |
| | LOCAL INTERCONNECT | | |

SEMICONDUCTOR INTEGRATED CIRCUIT DEVICE

CROSS-REFERENCE TO RELATED APPLICATIONS

This is a continuation of International Application No. PCT/JP2020/002569 filed on Jan. 24, 2020, which claims priority to Japanese Patent Application No. 2019-026605 filed on Feb. 18, 2019. The entire disclosures of these applications are incorporated by reference herein.

TECHNICAL FIELD

The present disclosure relates to a semiconductor integrated circuit device including a standard cell (hereinafter also referred to simply as a cell as appropriate) including a transistor having a three-dimensional configuration.

Standard cell methodology is known as a method of forming a semiconductor integrated circuit on a semiconductor substrate. The standard cell methodology is a method of designing an LSI chip by preparing in advance, as standard cells, basic units (e.g., an inverter, a latch, a flip-flop, or a full adder) with specific logic functions, arranging the standard cells on a semiconductor substrate, and connecting the standard cells by interconnects.

Further, the gate length of a transistor which is a basic component of an LSI has been reduced (scaling) to improve integration degree, reduce the operating voltage, and improve the operating speed. However, an off-current due to excessive scaling and a significant increase in power consumption due to the off-current have been concerned in recent years. To address these concerns, studies have been actively conducted for a transistor having a three-dimensional configuration (hereinafter, three-dimensional transistor) in which a structure of a transistor is changed from a traditional planar type to a three-dimensional type.

Ryckaert J. et al., "The Complementary FET (CFET) for CMOS scaling beyond N3", 2018 Symposium on VLSI Technology Digest of Technical Papers and Non-Patent Documents 2: A. Mocuta et al., "Enabling CMOS Scaling Towards 3 nm and Beyond", 2018 Symposium on VLSI Technology Digest of Technical Papers disclose, as a novel device, a three dimensional device in which a P-type FET and an N-type FET each having a three-dimensional configuration are stacked in a direction perpendicular to a substrate, and a standard cell using such a three-dimensional device.

SUMMARY

A three-dimensional device having a three-dimensional P-type FET and a three-dimensional N-type FET stacked perpendicularly to a substrate is referred to as a CFET (Complementary FET) in this specification, as in the description of Documents 1: Ryckaert J. et al., "The Complementary FET (CFET) for CMOS scaling beyond N3", 2018 Symposium on VLSI Technology Digest of Technical Papers. Further, a direction perpendicular to the substrate is referred to as a depth direction.

Here, the standard cell includes, for example, a cell having a logic function such as a NAND gate or a NOR gate (hereinafter, referred to as a logic cell as appropriate) and a cell having no logic function. An example of a cell having no logic function is a "termination cell". The "termination cell" refers to a cell that does not contribute to the logic function of a circuit block and is used to terminate the circuit block. By arranging the termination cells, it is possible to suppress variations in the finished shape of the layout pattern of the cells arranged inward from the termination cell, and to suppress manufacturing variations of the semiconductor integrated circuit devices, thus improving the yield and the reliability of the semiconductor integrated circuit devices.

To date, the structure of the termination cell using the CFET and the layout of the semiconductor integrated circuit device including the termination cell using the CFET have not been specifically considered.

An object of the present disclosure is to provide a layout of a semiconductor integrated circuit device including a termination cell using a CFET.

A first aspect of the present disclosure is a semiconductor integrated circuit device including a plurality of cell rows each including a plurality of standard cells aligned in a first direction, and a first cell row which is one of the plurality of cell rows includes a first standard cell having a logic function and a second standard cell having no logic function, the second standard cell being arranged at one or each end of the first cell row. The first standard cell includes a first power supply line that extends in the first direction and is configured to supply a first power supply voltage, a second power supply line that extends in the first direction and is configured to supply a second power supply voltage different from the first power supply voltage, a first transistor that is a three-dimensional transistor of a first conductive type, a second transistor that is a three-dimensional transistor of a second conductive type, which is formed at a position higher than the first transistor relative to a depth direction, a gate line that extends in a second direction perpendicular to the first direction and in the depth direction, which serves as a gate of each of the first transistor and the second transistor, a first local interconnect and a second local interconnect that extends in the second direction and are connected to a source and a drain of the first transistor, respectively, and a third local interconnect and a fourth local interconnect that extend in the second direction and are connected to a source and a drain of the second transistor, respectively. The second standard cell includes a third power supply line that extends in the first direction and is configured to supply the first power supply voltage, a fourth power supply line that extends in the first direction and is configured to supply the second power supply voltage, a dummy gate line that extends in the second direction and the depth direction and is arranged in the depth direction in the same layer as the gate line, a fifth local interconnect that is arranged in the depth direction in the same layer as the first local interconnect and the second local interconnect, A sixth local interconnect that is arranged in the depth direction in the same layer as the third local interconnect and the fourth local interconnect, the sixth local interconnect overlapping the fifth local interconnect in plan view.

According to the aspect, the second standard cell having no logic function is arranged at one or each end of the first cell row having the first standard cell having a logic function. The dummy gate line of the second standard cell is arranged in the depth direction in the same layer as the gate line of the first standard cell. The fifth local interconnect of the second standard cell is arranged in the depth direction in the same layer as the first local interconnect and the second local interconnect of the first standard cell. The sixth local interconnect of the second standard cell is arranged in the depth direction in the same layer as the third local interconnect and the fourth local interconnect of the first standard cell. That is, with the dummy gate lines and the local interconnects in the second standard cell arranged on one or each end of the first cell row, the gate lines including the dummy gate lines and the local interconnects are regularly arranged. This suppresses variations in the finished shape of the layout pattern of the standard cells arranged inward from the second standard cell, suppresses manufacturing variations of the semiconductor integrated circuit devices, thus improving the yield and the reliability of the semiconductor integrated circuit devices.

A second aspect of the present disclosure is a semiconductor integrated circuit device including a plurality of cell rows each including a plurality of standard cells aligned in a first direction, wherein a first cell row which is one of the plurality of cell rows includes a first standard cell having a logic function and a second standard cell having no logic function, the second standard cell being arranged at one or each end of the first cell row. The first standard cell includes a first power supply line that extends in the first direction and is configured to supply a first power supply voltage, a second power supply line that extends in the first direction and is configured to supply a second power supply voltage different from the first power supply voltage, a first transistor that is a three-dimensional transistor of a first conductive type, a second transistor that is a three-dimensional transistor of a second conductive type, which is formed at a position higher than the first transistor relative to a depth direction, a gate line extending in a second direction perpendicular to the first direction and in the depth direction, which serves as a gate of each of the first transistor and the second transistor, a first local interconnect and a second local interconnect that extend in the second direction and are connected to a source and a drain of the first transistor, respectively, and a third local interconnect and a fourth local interconnect that extend in the second direction and are connected to a source and a drain of the second transistor, respectively. The second standard cell includes a third power supply line that extends in the first direction and is configured to supply the first power supply voltage, a fourth power supply line that extends in the first direction and is configured to supply the second power supply voltage, a first dummy transistor that is a three-dimensional transistor of the first conductive type, which is arranged in the depth direction in the same layer as the first transistor, a second dummy transistor that is a three-dimensional transistor of the second conductive type, which is arranged in the depth direction in the same layer as the second transistor, a dummy gate line that extends in the second direction and the depth direction and is arranged in the depth direction in the same layer as the gate line, the dummy gate line configured to serve as a gate of each of the first dummy transistor and the second dummy transistor, a fifth local interconnect that extends in the second direction, and is arranged in the depth direction in the same layer as the first local interconnect and the second local interconnect, the fifth local interconnect connected to one of the source and the drain of the first dummy transistor, a sixth local interconnect that extends in the second direction, and is arranged in the depth direction in the same layer as the third local interconnect and the fourth local interconnect, the fifth local interconnect connected to one of the source and the drain of the second dummy transistor. The sixth local interconnect overlaps the fifth local interconnect in plan view.

According to the aspect, the second standard cell having no logic function is arranged at one or each end of the first cell row having the first standard cell having a logic function. The first dummy transistor and the second dummy transistor of the second standard cell are arranged in the depth direction in the same layer as the first standard cell, the first transistor and the second transistor. The dummy gate line of the second standard cell is arranged in the depth direction in the same layer as the gate line of the first standard cell. The fifth local interconnect of the second standard cell is arranged in the depth direction in the same layer as the first local interconnect and the second local interconnect of the first standard cell. The sixth local interconnect of the second standard cell is arranged in the depth direction in the same layer as the third local interconnect and the fourth local interconnect of the first standard cell. That is, with the dummy transistors, the dummy gate lines and the local interconnects in the second standard cell arranged on one or each end of the first cell row, the transistors including the dummy transistors, the gate lines including the dummy gate lines, and the local interconnects are regularly arranged. This suppresses variations in the finished shape of the layout pattern of the standard cells arranged inward from the second standard cell, suppresses manufacturing variations of the semiconductor integrated circuit devices, thus improving the yield and the reliability of the semiconductor integrated circuit devices.

A third aspect of the present disclosure is a semiconductor integrated circuit device including A plurality of cell rows, each of which includes a plurality of standard cells arranged in a first direction, the cell rows arranged in a second direction perpendicular to the first direction. The plurality of cell rows includes a first cell row including a first standard cell having a logic function and a second standard cell row including a second standard cell having no logic function, the second cell row being arranged at one or each end of the plurality of cell rows in the second direction. The first standard cell includes a first power supply line that extends in the first direction and is configured to supply a first power supply voltage, a second power supply line that extends in the first direction and is configured to supply a second power supply voltage different from the first power supply voltage, a first transistor that is a three-dimensional transistor of a first conductive type, a second transistor that is a three-dimensional transistor of a second conductive type, which is formed at a position higher than the first transistor relative to a depth direction, a gate line that extends in a second direction perpendicular to the first direction and in the depth direction, which serves as a gate of each of the first transistor and the second transistor, a first local interconnect and a second local interconnect that extend in the second direction and are connected to a source and a drain of the first transistor, respectively, and a third local interconnect and a fourth local interconnect that extend in the second direction and are connected to a source and a drain of the second transistor, respectively. The second standard cell includes a third power supply line that extends in the first direction and is configured to supply the first power supply voltage or the second power supply voltage, a first dummy transistor that is a three-dimensional transistor of the first conductive type, which is arranged in the depth direction in the same layer as the first transistor, a second dummy transistor that is a three-dimensional transistor of the second conductive type, which is arranged in the depth direction in the same layer as the second transistor, a dummy gate line that extends in the second direction and the depth direction and is arranged in the depth direction in the same layer as the gate line, the dummy gate line configured to serve as a gate of each of the first dummy transistor and the second dummy transistor, a fifth local interconnect that extend in the second direction, and is arranged in the depth direction in the same layer as the first local interconnect and the second local interconnect, the fifth local interconnect connected to one of the source and the drain of the first dummy transistor, a sixth local interconnect that extends in the second direction, and is arranged in the depth direction in the same layer as the third local interconnect and the fourth local interconnect, the fifth local interconnect connected to one of the source and the drain of the second dummy transistor. The sixth local interconnect overlaps the fifth local interconnect in plan view.

According to the aspect, the second cell row including the second standard cell having no logic function is arranged at one or both ends, in relation to the second direction, of the plurality of cell rows including the first cell row including the first standard cell having a logic function. The first dummy transistor and the second dummy transistor of the second standard cell are arranged in the depth direction in the same layer as the first standard cell, the first transistor and the second transistor. The dummy gate line of the second standard cell is arranged in the depth direction in the same layer as the gate line of the first standard cell. The fifth local interconnect of the second standard cell is arranged in the same layer as the first local interconnect and the second local interconnect of the first standard cell. The sixth local interconnect of the second standard cell is arranged in the same layer as the third local interconnect and the fourth local interconnect of the first standard cell. That is, with the dummy transistors, the dummy gate lines and the local interconnects in the second standard cell arranged in the second cell row on one or both ends of the plurality of cell rows in relation to the second direction, the transistors including the dummy transistors, the gate lines including the dummy gate lines, and the local interconnects are regularly arranged. This suppresses variations in the finished shape of the layout pattern of the standard cells arranged inward from the second standard cell, suppresses manufacturing variations of the semiconductor integrated circuit devices, thus improving the yield and the reliability of the semiconductor integrated circuit devices.

With the present disclosure, it is possible to suppress manufacturing variations of the semiconductor integrated circuit devices using a CFET, improve the yield and the reliability of the semiconductor integrated circuit devices.

BRIEF DESCRIPTION OF THE DRAWINGS

FIG. 2 includes illustrations (a) and (b) each showing a plan view of a layout configuration of the standard cell according to a first embodiment.

FIG. 3 includes illustrations (a) and (b) each showing a cross-sectional view of the layout configuration of FIG. 2 as seen in a lateral direction in plan view.

FIG. 5 includes illustrations (a) and (b) that are plan views showing another layout configuration of the termination cells according to the first embodiment.

FIG. 7 includes illustrations (a) and (b) each showing a plan view of a layout configuration of a standard cell according to a second embodiment.

FIG. 9 includes illustrations (a) and (b) each showing a plan view of another layout configuration of the termination cell according to the second embodiment.

FIG. 10 includes illustrations (a) and (b) each showing a plan view of a layout configuration of a standard cell according to a third embodiment.

FIG. 11 includes illustrations (a) and (b) each showing a plan view of another layout configuration of the termination cell according to the third embodiment.

FIG. 12 includes illustrations (a) and (b) each showing a plan view of another layout configuration of the termination cell according to the third embodiment.

DETAILED DESCRIPTION

Embodiments will be described below in detail with reference to the drawings. The following embodiments assume that a semiconductor integrated circuit device includes a plurality of standard cells (simply referred to as cells as appropriate, in this specification), and that at least a part of the plurality of standard cells includes a CFET, that is, a three-dimensional device in which a P-type FET and an N-type FET each having a three-dimensional configuration are perpendicularly stacked on a substrate.

Figure 13:
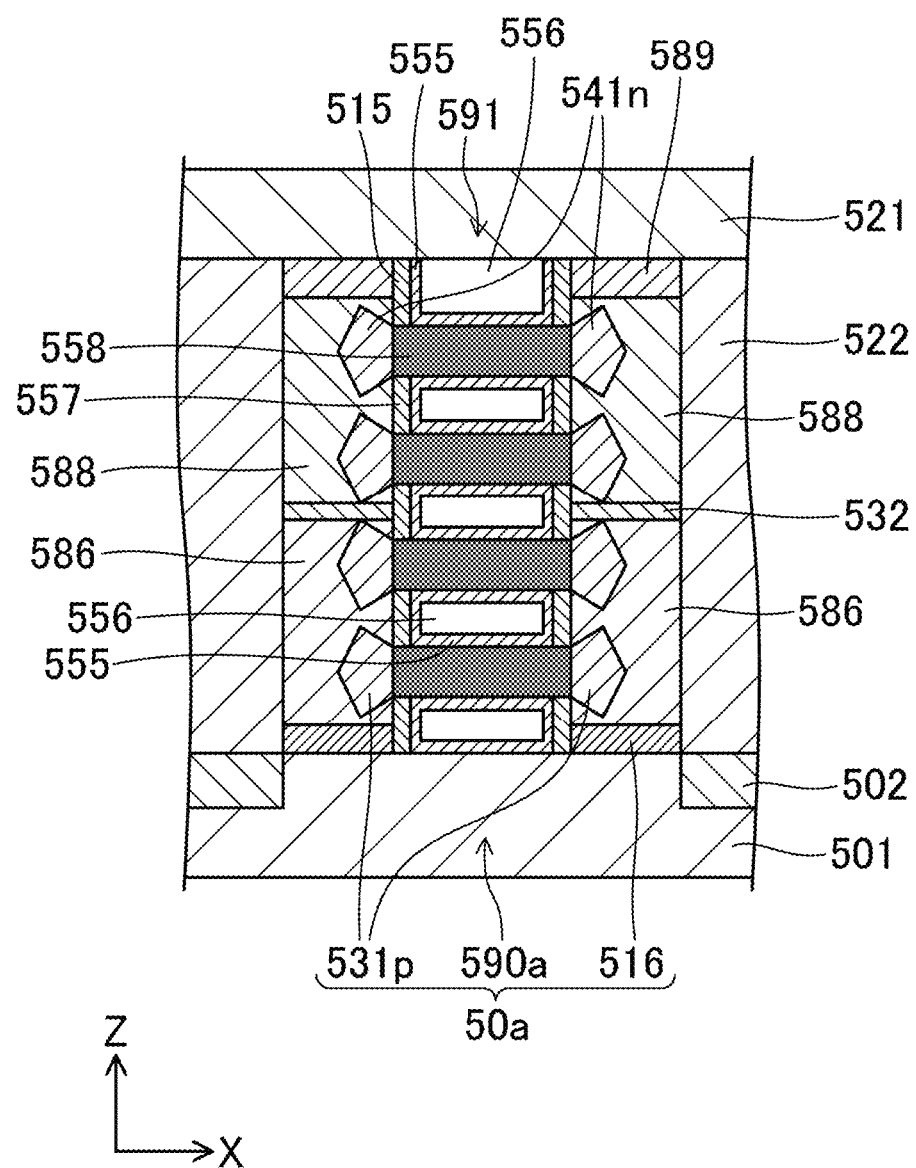
FIG. 13 is a cross-sectional view showing a structure of a semiconductor device including a CFET.
Figure 14:
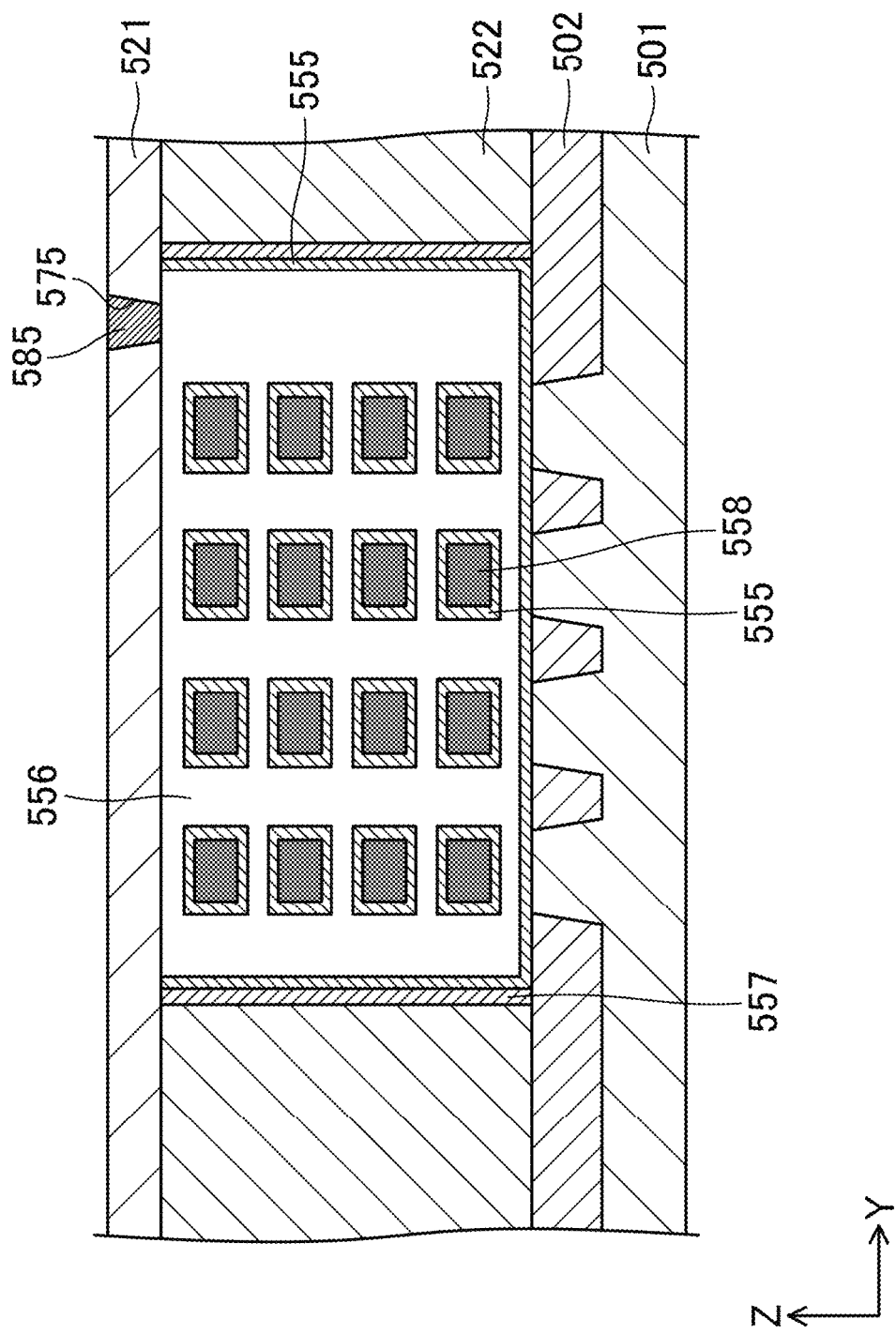
FIG. 14 is a cross-sectional view showing a structure of a semiconductor device including a CFET.
Figure 15:
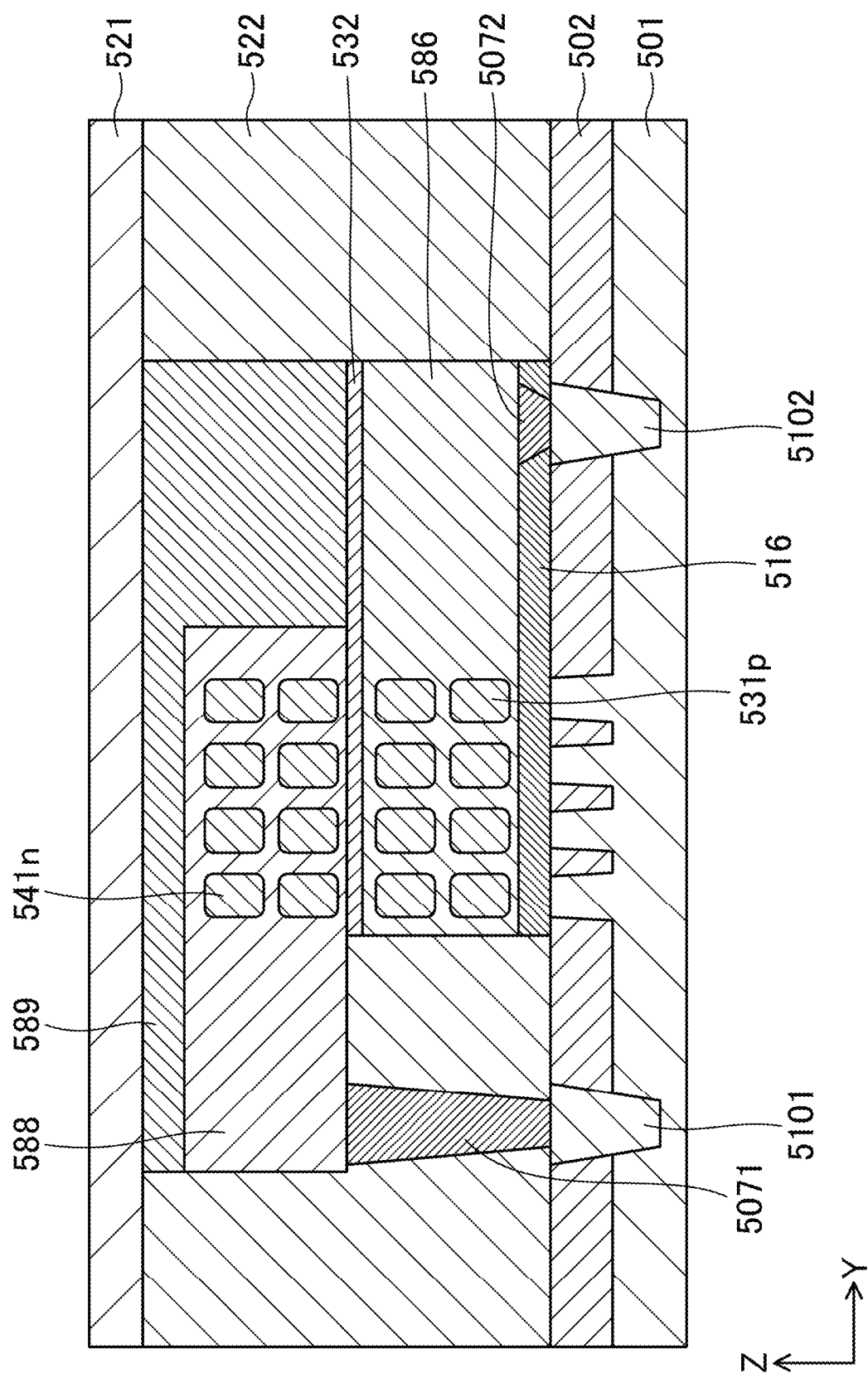
FIG. 15 is a cross-sectional view showing a structure of a semiconductor device including a CFET.
Figure 16:
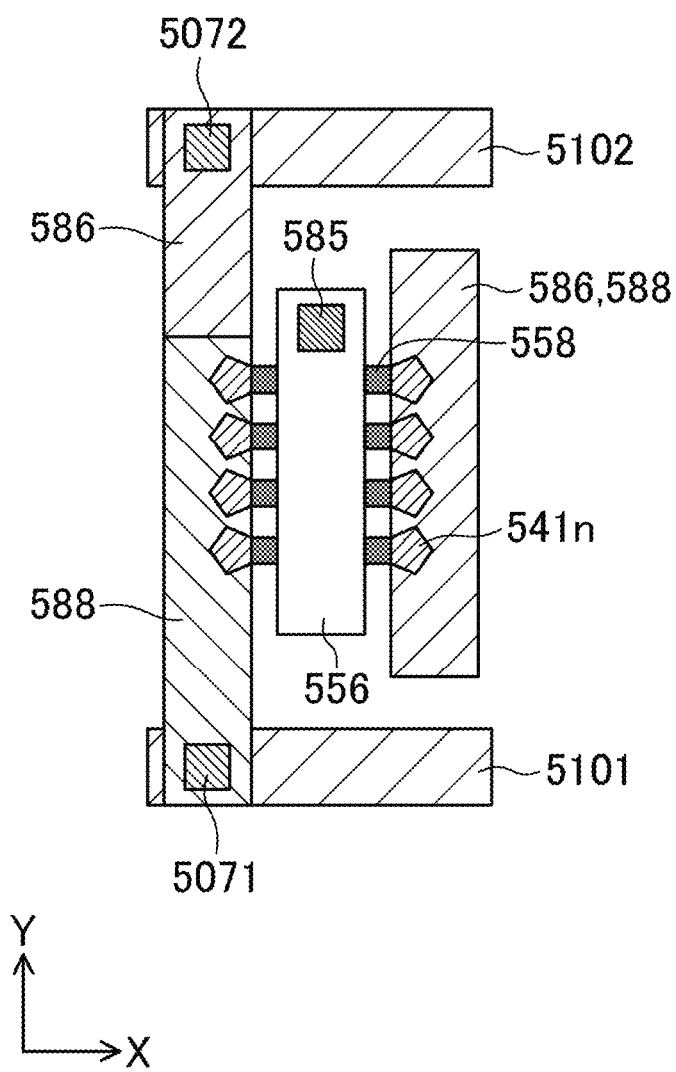
FIG. 16 is a cross-sectional view showing a structure of a semiconductor device including a CFET.

First, the basic configuration of the CFET will be described. FIGS. 13 to 16 are views showing a configuration of a semiconductor device including a CFET. FIG. 13 is a cross-sectional view taken along the X direction. FIG. 14 is a cross-sectional view of a gate portion, taken along the Y direction. FIG. 15 is a cross-sectional view of a source/drain portion, taken along the Y direction. FIG. 16 is a plan view. The X direction is a direction in which a nanowire extends. The Y direction is a direction in which a gate extends. The Z direction is the direction perpendicular to the substrate surface. Further, FIGS. 13 to 16 are each a schematic view, and dimensions, positions, and the like of the parts do not necessarily have to be consistent.

In this semiconductor device, an element isolation region 502 is formed on a surface of a semiconductor substrate 501 such as a silicon (Si) substrate. This element isolation region 502 defines an element active region 50a. In the element active region 50a, an N-type FET is formed on a P-type FET.

In the element active region 50a, a stacked transistor configuration 590a is formed on the semiconductor substrate 501. The stacked transistor configuration 590a includes a gate configuration 591 formed on the semiconductor substrate 501. The gate configuration 591 includes a gate electrode 556, a plurality of nanowires 558, gate insulating films 555, and insulating films 557. The gate electrode 556 extends in the Y direction and rises in the Z direction. The nanowires 558 penetrate the gate electrode 556 in the X direction and are aligned in the Y direction and the Z direction. Each of the gate insulating films 555 is formed between the gate electrode 556 and the nanowire 558. The gate electrode 556 and the gate insulating film 555 are formed at positions recessed in the X direction from both ends of the nanowire 558, and the insulating films 557 are formed at the recessed portions. On the semiconductor substrate 501, insulating films 516 are formed on a side of the insulating film 557 on both sides. Reference character 521 and 522 each denote an interlayer insulating film.

Further, as shown in FIG. 15, the gate electrode 556 is connected to a wire in an upper layer through a via 585 provided in an opening 575.

For example, the gate electrode 556 may be made of titanium, titanium nitride or polycrystalline silicon. For example, the gate insulating film 555 may be made of a high dielectric constant material such as hafnium oxide, aluminum oxide, or an oxide of hafnium and aluminum. For example, the nanowires 558 may be made of silicon, and the like. For example, the insulating film 516 and the insulating film 557 may be made of silicon oxide, silicon nitride, or the like.

In this semiconductor device, four nanowires 558 are aligned in the Z direction. In the element active region 50a, a P-type semiconductor layer 531p is formed at each end portion of two nanowires 558 closer to the semiconductor substrate 501. Two local interconnects 586 in contact with the P-type semiconductor layers 531p are formed so as to sandwich the gate configuration 591 in the X direction. Further, an N-type semiconductor layer 541n is formed to each end portion of two nanowires 558 far from the semiconductor substrate 501. Two local interconnects 588 in contact with the N-type semiconductor layers 541n are formed so as to sandwich the gate configuration 591 in the X direction. Between the local interconnects 586 and the local interconnects 588, insulating films 532 are formed. On the local interconnect 588, insulating films 589 are formed. For example, the P-type semiconductor layer 531p is a p-type SiGe layer, and the N-type semiconductor layer 541n is an n-type Si layer. For example, the insulating films 532 may be made of silicon oxide, silicon nitride, and the like.

Further, as shown in FIG. 16, the local interconnects 588 are connected to a buried line 5101 through a via 5071. The local interconnects 586 are connected to a buried line 5102 through a via 5072.

As described, the stacked transistor configuration 590a has the gate electrode 556, the nanowires 558, and the P-type FET including the gate insulating films 555 and the P-type semiconductor layers 531p. In this P-type FET, each P-type semiconductor layer 531p on one side serves as the source region, and each P-type semiconductor layer 531p on the other side serves as the drain region. Each of the nanowires 558 serves as a channel. The stacked transistor configuration 590a also has the N-type FET including the gate electrode 556, the nanowires 558, the gate insulating films 555, and the N-type semiconductor layers 541n. In this N-type FET, each N-type semiconductor layer 541n on one side serves as the source region, and each P-type semiconductor layer 541n on the other side serves as the drain region. Each of the nanowires 558 serves as a channel.

As to the layers above the stacked transistor configuration, vias and metal wires provide wiring and the like between transistors, which is achievable by a known wiring process.

It should be noted that, the number of nanowires in each of the P-type FET and the N-type FET is four in the Y direction and two in the Z direction, that is, eight in total. However, the number of nanowires is not limited to this. The number of nanowires in the P-type FET and that in the N-type FET may be different from each other.

Further, the semiconductor layer portion that is formed at each end of the nanowire and that constitutes a terminal to serve as the source or the drain of the transistor is referred to as "pad". In the above-described basic configuration of the CFET, the P-type semiconductor layer 531p and the N-type semiconductor layer 541n correspond to the pad.

Further, the plan views and cross-sectional views referenced in the description of embodiments below may omit insulating films. Further, the plan views and cross-sectional views referenced in the description of embodiments below may illustrate the nanowires and pads on both sides of the nanowires in the form of a simplified linear shape. Further, the expression "the same size" and the like in this specification indicating that the size and the like are the same encompasses a range of variation in manufacturing.

(Configuration of Circuit Block)

Figure 1:
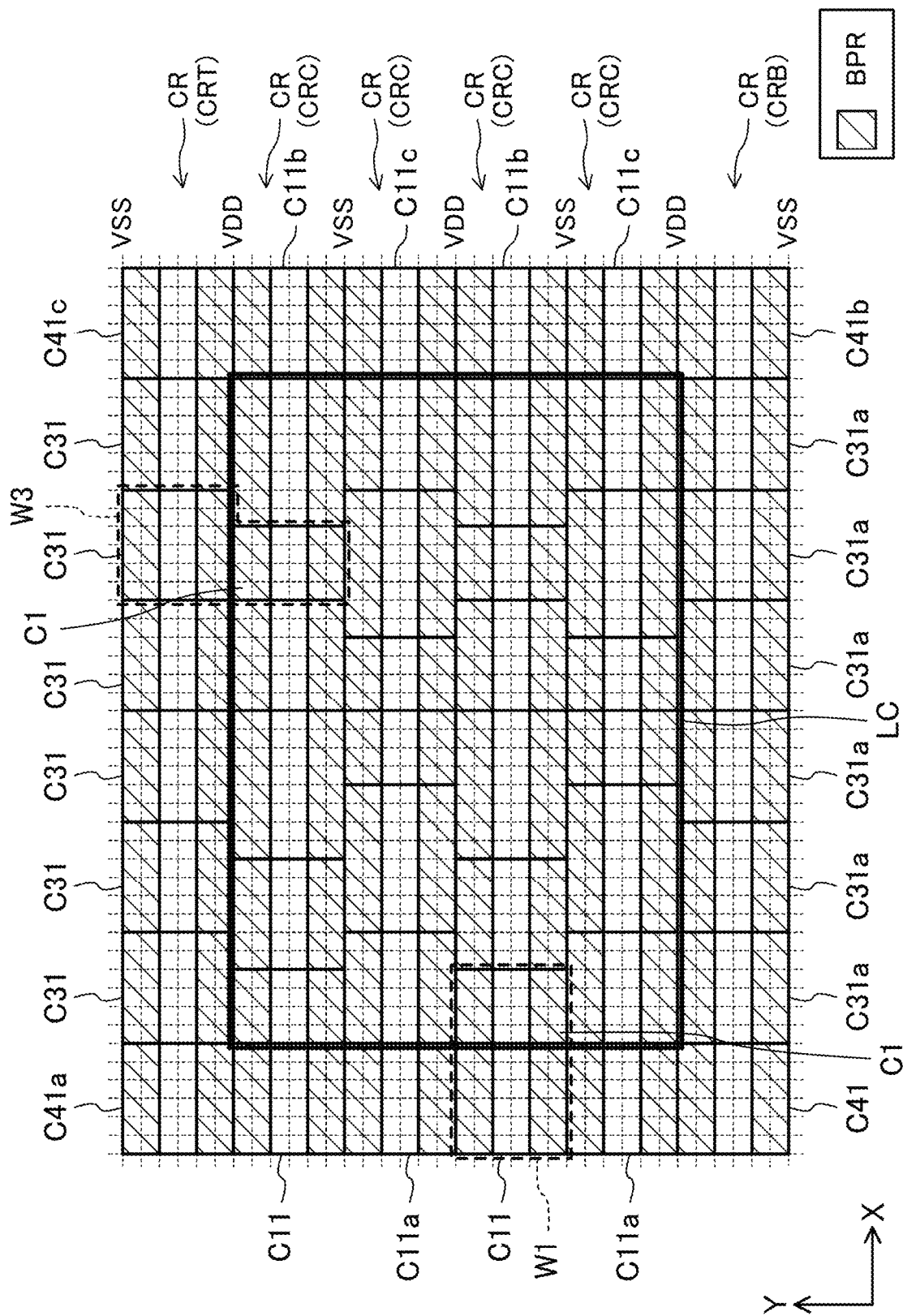
FIG. 1 is a plan view showing an exemplary layout configuration of a circuit block using standard cells.

FIG. 1 is a plan view showing a layout configuration of a circuit block using standard cells. FIG. 1 only illustrates power supply lines arranged in the standard cells and the other wires are omitted.

It should be noted that, in the following description, the lateral direction of the figure in the plan view of FIG. 1 or the like is the X direction (corresponding to the first direction), the longitudinal direction is Y direction (corresponding to the second direction), and a direction perpendicular to the substrate surface is the Z direction (corresponding to the depth direction). Further, dotted lines running longitudinally and laterally in the plan view of FIG. 1 and the like illustrates a grid used for arranging components at the time of designing. Cells of the grid are arranged at equal intervals in the X direction, and arranged at equal intervals in the Y direction. It should be noted that the intervals of the cells in the X direction and those in the Y direction may be the same or different.

Further, in the following description, members and parts given the same reference characters are identical to one another, and the description for them may be omitted.

In the layout shown in FIG. 1, a plurality of cells aligned in the X direction constitute a cell row CR. A plurality of cell rows CR (six rows in FIG. 1) are arranged in the Y direction. At each end of each cell relative to the Y direction, power supply lines are formed, and power source potentials VDD and VSS are supplied to the cell from the outside through the power supply lines. Further, the arrangement of cells in one row is inverted in Y direction from the arrangement of cells in an adjacent cell row, so that the power supply lines for supplying the power source potentials VDD and VSS are alternated in the Y direction.

The plurality of cells include a cell having a logic function of a NAND gate, a NOR, gate and the like (include a later-described inverter cell C1 having a logic function of an inverter), and a termination cell including no logic function.

Here, the "termination cell" refers to a cell that does not contribute to the logic function of a circuit block and is arranged at termination ends of the circuit block. The "termination end of the circuit block" herein means both ends of a cell row constituting the circuit block (both ends relative to the X direction in this case), the uppermost row and the lowermost row of the circuit block (cell rows at both ends relative to the Y direction in this case), and the like. That is, the "termination cell" is arranged at both ends of the cell rows relative to the X direction and both ends of the cell rows relative to the Y direction, which are termination ends of the circuit block. By arranging the termination cells, it is possible to suppress variations in the finished shape of the layout pattern of the cells arranged inward from the termination cell, and to suppress manufacturing variations of the semiconductor integrated circuit devices, thus improving the yield and the reliability of the semiconductor integrated circuit devices.

In this embodiment, a dummy gate line is arranged in the termination cell. The "dummy gate line" herein is a gate line that does not form a transistor, and a gate line that forms a transistor that does not contribute to a logic function of the circuit.

In the layout shown in FIG. 1, there is a logic cell having a logic function at a center portion of the circuit block, and a rectangular logic unit LC that achieves the circuit function is arranged. The termination cell part is formed along the exterior of the circuit block so as to surround the logic unit LC.

In FIG. 1, an inverter cell C1 is arranged in the logic unit LC, and termination cells C11, C11a to C11c, C31, C31a, C41, and C41a to C41c are arranged in the termination cell part. The termination cells C11a, C11b, and C11c are arranged so that their arrangement is an inversion of the termination cells C11 in the Y direction, X direction, and in the X direction and Y direction, respectively. The termination cells C31a are arranged so that their arrangement is an inversion of the termination cells C31 in the Y direction. The termination cells C41 and C41a to C41c are cells having the same configuration as the termination cells C11 and C11a to C11c, respectively. That is, the termination cells C41a, C41b, and C41c are arranged so that their arrangement is an inversion of the termination cell C41 in the Y direction, X direction, and in the X direction and Y direction, respectively.

Specifically, in a cell row CRT arranged at the uppermost relative to the Y direction of the circuit block, the termination cell C41a is arranged at the left end of the figure, and the termination cell C41c at the right end of the figure. Between the termination cells C41a and C41c, a plurality of the termination cells C31 are aligned in the X direction. Further, in a cell row CRB arranged at the lowermost relative to the Y direction of the circuit block, the termination cell C41 is arranged at the left end of the figure, and the termination cell C41b at the right end of the figure. Between the termination cells C41 and C41b, a plurality of the termination cells C31a are aligned in the X direction. Further, between the cell row CRT and the cell row CRB, cell rows CRC each having the termination cell C11 arranged on the left end of the figure and the termination cell C11b arranged on the right end of the figure, and cell rows CRC each having the termination cell C11a arranged on the left end of the figure and the termination cell C11c on the right end of the figure are alternated in the Y direction. Further, a cell constituting the logic unit LC is arranged between the termination cells C11 and C11a and the termination cells C11b and C11c. Therefore, in FIG. 1, a termination cell having the same configuration as the termination cell C11 is arranged along the left end and the right end of the logic unit LC in the figure, and a termination cell having the same configuration as the termination cell C31 is arranged along the upper end and the lower end of the logic unit LC in the figure. Further, a termination cell having the same configuration as the termination cell C41 is arranged in corners of the circuit block (four corners of the circuit block).

First Embodiment

FIG. 2 is an enlarged view of a part W1 in FIG. 1, and is a plan view showing a layout configuration of the standard cell in this embodiment. FIG. 3 is a cross-sectional view of FIG. 2. Specifically, an illustration (a) of FIG. 2 shows a portion including a three-dimensional transistor (here, a P-type nanowire FET) formed in the lower portion, that is, on the side closer to the substrate. An illustration (b) of FIG. 2 shows a portion including a three-dimensional transistor (here, an N-type nanowire FET) formed in the upper portion, that is, on the side distant from the substrate. An illustration (a) of FIG. 3 is a cross-sectional view taken along line X1-X1' in FIG. 2, and an illustration (b) of FIG. 3 is a cross-sectional view taken along line X2-X2' in FIG. 2.

As shown in FIG. 1 to FIG. 3, the inverter cell C1 is arranged on the left side of the logic unit LC in the drawing, and the termination cell C11 is arranged adjacent to the left side of the inverter cell C1.

(Configuration of Inverter Cell)

As shown in the illustration (a) of FIG. 2, the inverter cell C1 has, at its ends relative to the Y direction, power supply lines 11 and 12 extending in the X direction. Both of the power supply lines 11 and 12 are each buried power rail (BPR) formed in a buried wiring layer. The power supply line 11 supplies a power supply voltage VDD, and the power supply line 12 supplies a power supply voltage VSS.

In the M1 wiring layer, lines 71 and 72 each extending in the X direction are formed. The line 71 corresponds to an input A, and the line 72 corresponds to an output Y.

A nanowire 21 extending in the X direction is formed in the lower portion of the cell, and a nanowire 26 extending in the X direction is formed in the upper portion of the cell. The nanowires 21 and 26 overlap each other in plan view. At both ends of the nanowire 21, pads 22a and 22b doped with a P-type semiconductor are formed. At both ends of the nanowire 26, pads 27a and 27b doped with an N-type semiconductor are formed. The nanowire 21 constitutes a channel portion of a P-type transistor P1, and the pads 22a and 22b constitute terminals serving as a source or a drain of the P-type transistor P1. The nanowire 26 constitutes a channel portion of an N-type transistor N1, and the pads 27a and 27b constitute terminals serving as a source or a drain of the N-type transistor N1. The N-type transistor N1 is formed at a position higher than the P-type transistor P1 relative to the Z direction.

The gate line 31 extends in the Y direction substantially at the center in the X direction, and extends in the Z direction from the lower portion to the upper portion of the cell. The gate line 31 serves as gates of the P-type transistor P1 and the N-type transistor N1. That is, the nanowire 21, the gate line 31, and the pads 22a and 22b constitute the P-type transistor P1. The nanowire 26, the gate line 31, and the pads 27a and 27b constitute the N-type transistor N1. Further, at both ends of the cell relative to the X direction, dummy gate lines 35a and 35b are formed. The dummy gate lines 35a and 35b extend in the Y direction and the Z direction, similarly to the gate line 31.

The gate lines 31 and the dummy gate lines 35a and 35b are arranged at the same pitch Pg in the X direction. The gate lines 31 and the dummy gate lines 35a and 35b have the same lengths Lg in the Y direction and the same widths Wg in the X direction.

Local interconnects (LI) 41 and 42 extending in the Y direction are formed in the lower portion of the cell. The local interconnect 41 is connected to the pad 22a. The local interconnects 42 is connected to the pad 22b. Local interconnects 51 and 52 extending in the Y direction are formed in the upper portion of the cell. The local interconnects 51 is connected to the pad 27a. The local interconnects 52 is connected to the pad 27b.

The local interconnects 41 extends to a position overlapping the power supply line 11 in plan view, and is connected to the power supply line 11 through a contact 61. The contact 61 is formed at a position where the power supply line 11 and the local interconnect 41 overlap each other in plan view. The local interconnects 51 extends to a position overlapping the power supply line 12 in plan view, and is connected to the power supply line 12 through a contact 62. The contact 62 is formed at a position where the power supply line 12 and the local interconnect 51 overlap each other in plan view. The local interconnects 42 and 52 are connected through a contact 63. The contact 63 is formed at a position where the local interconnects 42 and the local interconnects 52 overlap each other in plan view.

The upper ends of the local interconnects 41 and 42, and 52 relative to the Y direction of the figure are arranged at the same position. The upper ends, relative to the Y direction in the figure, of the local interconnects 41 and 42, and 52 out of the local interconnects 41, 42, 51, and 52 each corresponds to one end that is most distant from the P-type transistor P1 and the N-type transistor N1. The lower end, relative to the Y direction of the figure, of the local interconnect 51 out of the local interconnects 41, 42, 51, and 52 corresponds to another end that is most distant from the P-type transistor P1 and the N-type transistor N1.

As shown in FIG. 2, the line 71 (input A) is connected to the gate line 31 through a contact 81. The line 72 (output Y) is connected to the local interconnect 52 via a contact 82.

As described above, the inverter cell C1 includes the P-type transistor P1 and the N-type transistor N1, and achieves an inverter circuit having the input A and the output Y. That is, the inverter cell C1 is a standard cell having a logic function.

(Configuration of Termination Cell)

As shown in FIG. 1, the termination cell C11 is arranged at the left end of the cell row CRC relative to the X direction.

As shown in the illustration (a) of FIG. 2, at both ends of the termination cell C11 relative to the Y direction, power supply lines 111 and 112 extending in the X direction are provided. The power supply lines 111 and 112 are both buried power rails (BPR) formed in a buried wiring layer. The power supply line 111 supplies the same power supply voltage VDD as the power supply wiring 11, and the power supply line 112 supplies the same power supply voltage VSS as the power supply wiring 12.

At both ends of the cell relative to the X direction, dummy gate lines 131 and 134 are formed so as to extend in the Z direction from the upper portion to the lower portion of the cell and extend in the Y direction. Between the dummy gate lines 131 and 134, dummy gate lines 132 and 133 are formed which extend in the Z direction and Y direction similarly to the dummy gate lines 131 and 134. The dummy gate line arranged at the boundary between the inverter cell C1 and the termination cell C11 corresponds to the dummy gate line 35*a* of the inverter cell C1 and the dummy gate line 131 of the termination cell C11.

In the lower portion of the cell, local interconnects 141 and 142 extending in the Y direction are formed. The local interconnect 141 is arranged between the dummy gate lines 131 and 132, and the local interconnect 142 is arranged between the dummy gate lines 132 and 133. Local interconnects 151 and 152 extending in the Y direction are formed in the upper portion of the cell. The local interconnect 151 is arranged between the dummy gate lines 131 and 132, and the local interconnect 152 is arranged between the dummy gate lines 132 and 133. Each of the local interconnects 141, 142, 151, and 152 extends to a position overlapping the power supply lines 111 and 112 in plan view. The local interconnects 141,142 respectively overlap the local interconnects 151,152 in plan view.

The dummy gate lines 131 to 134 and the local interconnects 141, 142, 151, and 152 are not connected to the other wiring.

As described above, the termination cell C11 does not include a transistor. That is, the termination cell C11 is a standard cell having no logic function.

As shown in FIGS. 2 and 3, the gate line 31 and the dummy gate lines 35*a* (131), 35*b*, and 132 to 134 have the same lengths Lg relative to the Y direction and the same widths Wg relative to the X direction. The gate line 31 and the dummy gate lines 35*a* (131), 35*b*, and 132 to 134 are arranged at the same pitch Pg in the X direction, and are arranged in the same layer in the Z direction.

The local interconnects 41, 42, 141, and 142 are arranged at the same pitch P1 in the X direction and are arranged in the same layer in the Z direction. The local interconnects 51, 52, 151, and 152 are arranged at the same pitch P1 in the X direction and are arranged in the same layer in the Z direction.

Further, the local interconnects 141, 142, 151, and 152 are arranged such that their upper ends relative to the Y direction of the figure are at the same position as the upper end of the local interconnects 41, 42, and 52 relative to the Y direction of the figure. Further, the local interconnects 141, 142, 151, and 152 are arranged such that their lower ends relative to the Y direction of the figure are at the same position as the lower end of the local interconnect 51 relative to the Y direction of the figure.

According to the above configuration, the cell row CRC includes the inverter cell C1 having a logic function and the termination cell C11 having no logic function. The termination cell C11 is arranged at the left end of the cell row CRC. The dummy gate lines 131 to 134 in the termination cell C11 are arranged in the Z direction in the same layer as the gate line 31 in the inverter cell C1. The local interconnects 141 and 142 in the termination cell C11 are arranged in the Z direction in the same layer as the local interconnects 41 and 42 in the inverter cell C1. The local interconnects 151 and 152 in the termination cell C11 are arranged in the Z direction in the same layer as the local interconnects 51 and 52 in the inverter cell C1. That is, with the dummy gate lines and the local interconnects in the termination cell, the gate lines including the dummy gate lines and the local interconnects are regularly arranged. This suppresses variations in the finished shape of the layout pattern of the cells arranged inward of a circuit block from the termination cell, suppresses manufacturing variations of the semiconductor integrated circuit devices, thus improving the yield and the reliability of the semiconductor integrated circuit devices.

The dummy gate lines 131 to 134 have the same lengths Lg as those of the gate line 31 and the dummy gate lines 35*a* (131) and 35*b* in the Y direction. As a result, variations in the finished shape of the layout pattern can be suppressed, and manufacturing variations in the semiconductor integrated circuit device can be suppressed.

Further, the local interconnects 141, 142, 151, and 152 are arranged such that their upper ends relative to the Y direction of the figure are at the same position as the upper end of the local interconnects 41, 42, and 52 relative to the Y direction of the figure. Further, the local interconnects 141, 142, 151, and 152 are arranged such that their lower ends relative to the Y direction of the figure are at the same position as the lower end of the local interconnect 51 relative to the Y direction of the figure. The upper ends, relative to the Y direction, of the local interconnects (i.e., the ends on the upper side of the figure) in the termination cells are aligned with the upper ends, relative to the Y direction, of the local interconnects (the ends on the upper side of the figure) which are arranged in a cell constituting the logic unit LC and which are most distant from the transistors. Further, the lower ends, relative to the Y direction, of the local interconnects (i.e., the ends on the lower side of the figure) in the termination cells are aligned with the lower ends, relative to the Y direction, of the local interconnects (the ends on the lower side of the figure) which are arranged in a cell constituting the logic unit LC and which are most distant from the transistors. This makes the distance between the logic unit LC and the closest local interconnect constant, so that the performance predictability of the cells arranged in the logic unit LC can be improved.

Note that, although the termination cell C11 includes four dummy gate lines (dummy gate lines 131 to 134) and four local interconnects (local interconnects 141, 142, 151, and 152), the number of dummy gate lines and the number of local interconnects are not limited to this. However, the number of dummy gate lines and the number of local interconnects arranged in the termination cell C11 are numbers required for suppressing variations in finished dimensions of the end portion of the logic unit. Further, the number of local interconnects arranged in the upper portion of the termination cell C11 and the number of local interconnects arranged in the lower portion of the termination cell C11 may be different. Further, the cell width (dimension relative to the X direction) of the termination cell C11 may be changed by the number of dummy gate lines and the number of local interconnects arranged in the termination cell C11.

Further, the above-description deals with a case where the gate line 31 and the dummy gate lines 35a (131), 35b, and 132 to 134 have the same lengths Lg in the Y direction, but the present disclosure is not limited to this. However, with the gate line 31 and the dummy gate lines 35a (131), 35b, and 132 to 134 having the same length in the Y direction, the manufacturing variation of the circuit block can be further suppressed.

The upper ends of the local interconnects 141, 142, 151, and 152 relative to the Y direction of the figure are arranged at the same position as the upper end of the local interconnects 41, 42, and 52 in the Y direction of the figure, and the lower ends of the local interconnects 141, 142, 151, and 152 relative to the Y direction are arranged at the same position as the lower end of the local wiring 51 relative to the Y direction of the figure; however, the present disclosure is not limited to this. However, the manufacturing variation of the circuit block can be further suppressed by aligning the upper and lower ends, relative to the Y direction of the figure, of the local interconnect of the termination cell C11 with the upper and lower ends, relative to the Y direction of the figure, of the local interconnect of the inverter cell C1, respectively.

Further, in FIG. 1, at the right end of the cell row CRC in the figure, the termination cell C11 which is an inversion of the termination cell C11b in the X direction is arranged.

(Variation of Termination Cells)

Figure 4:
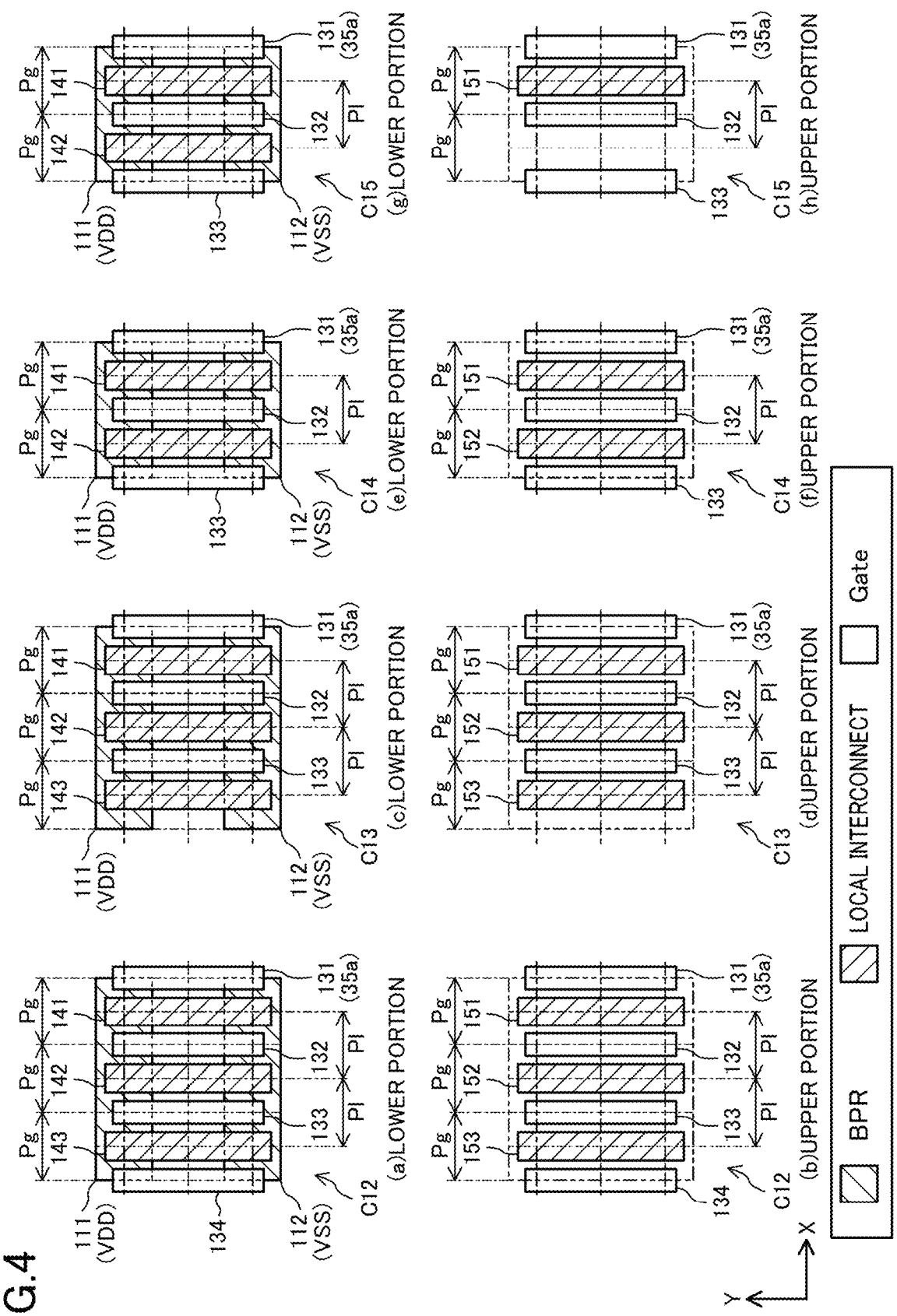
FIG. 4 includes illustrations (a) to (h) that are plan views of variations of the termination cells according to the first embodiment.

FIG. 4 is a plan view showing variations of the termination cells according to the present embodiment. Specifically, illustrations (a) and (b) of FIG. 4 each show a termination cell C12, illustrations (c) and (d) of FIG. 4 each show a termination cell C13, illustrations (e) and (f) of FIG. 4 each show a termination cell C14, and illustrations (g) and (h) of FIG. 4 each show a termination cell C15. The illustrations (a), (c), (e), and (g) of FIG. 4 each show the lower part of each cell, and the illustrations (b), (d), (f), and (h) of FIG. 4 each show the upper part of each cell.

The termination cell C12 has three local interconnects in each of the upper and the lower portions thereof.

As shown in the illustration (a) of FIG. 4, the local interconnect 143 extending in the Y direction is formed between the dummy gate lines 133 and 134 in the lower portion of the cell. The local interconnects 141, 142, and 143 are arranged at the same pitch P1 in the X direction, and are arranged in the same layer in the Z direction. The upper and lower ends of the local interconnects 141, 142, and 143 relative to the Y direction of the figure are arranged at the same position.

As shown in the illustration (b) of FIG. 4, in the upper portion of the cell, the local interconnect 153 extending in the Y direction is arranged between the dummy gate lines 133 and 134. The local interconnects 151, 152, and 153 are arranged at the same pitch P1 in the X direction, and are arranged in the same layer in the Z direction. The upper and lower ends of the local interconnects 151, 152, and 153 in the Y direction of the figure are arranged at the same position. The local interconnect 153 overlaps the local interconnect 143 in plan view.

As shown in the illustrations (c) and (d) of FIG. 4, the termination cell C13 is configured substantially similarly to the termination cell C12, but the dummy gate line 134 is not provided at the left end of the cell relative to the X direction.

As shown in the illustrations (e) and (f) of FIG. 4, the cell width (dimension relative to the X direction) of the termination cell C14 and that of the termination cell C11 are different. Specifically, the cell width of the termination cell C11 is (3×Pg), whereas the cell width of the terminal cell C14 is (2×Pg). The dummy gate line 134 is not provided in the termination cell C14.

As shown in the illustrations (g) and (h) of FIG. 4, the termination cell C15 is configured substantially similarly to the termination cell C14, but the local interconnect 152 is not provided.

Arranging the termination cells C12 to C15 instead of the termination cell C11 in FIG. 1 brings about a similar effect brought about by the termination cell C11.

(Variation of Termination Cell)

FIG. 5 is a plan view showing another layout configuration of the termination cell. An illustration (a) of FIG. 5 shows a lower part of the cell, and an illustration (b) of FIG. 5 shows an upper part of the cell. The termination cell C16 is configured substantially similarly to the termination cell C11, except in that the local interconnect is connected to the power supply line through a contact.

Specifically, the termination cell C16 includes contacts 161 to 164. The contact 161 and 163 overlap the power supply line 111 in plan view. The contact 162 and 164 overlap the power supply line 112 in plan view.

The local interconnect 141 is connected to the power supply line 111 through the contact 161. The local interconnect 142 is connected to the power supply line 112 through the contact 162. The local interconnect 151 is connected to the local interconnect 141 through the contact 163. The local interconnect 152 is connected to the local interconnect 142 through the contact 164. That is, the power source potential VDD is supplied from the power supply line 111 to the local interconnects 141 and 151, and the power source potential VSS is supplied from the power supply line 112 to the local interconnects 142 and 152.

Arranging the termination cell C16 instead of the termination cell C11 in FIG. 1 brings about a similar effect brought about by the termination cell C11.

Note that although the local interconnects 141 and 151 are connected to the power supply line 111, and the local interconnects 142 and 152 are connected to the power supply wiring 112, the present disclosure is not limited to this. The local interconnects 141 and 151 may be connected to the power supply line 112, and the local interconnects 142 and 152 may be connected to the power supply line 111. All of the local interconnects 141, 142, 151, and 152 may be connected to only one of the power supply lines 111 and 112. Part or all of the local interconnects 141, 142, 151, and 152 may be connected to the power supply line 111 or the power supply line 112.

Figure 6:
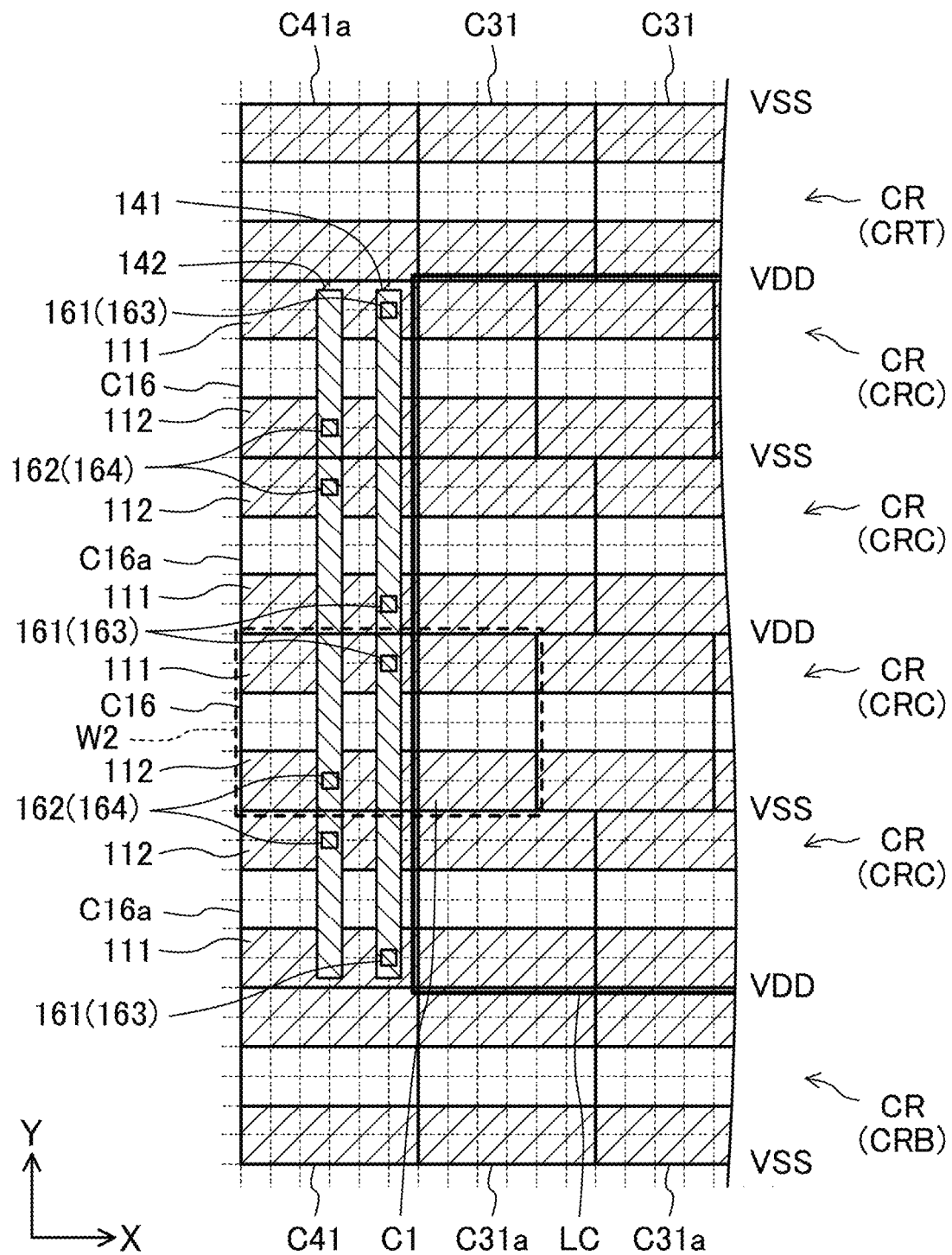
FIG. 6 is a plan view showing an exemplary layout configuration of the circuit block using the termination cell of FIG. 5.

FIG. 6 is a plan view showing a layout configuration of a circuit block using the termination cell shown in FIG. 5. Specifically, FIG. 6 is an enlarged view of the left side of the circuit block relative to the X direction. FIG. 6 only shows the power supply line arranged in each cell and the local interconnect and contacts arranged below the termination cells C16 and C16a. The termination cell C16a is arranged so as to be an inversion of the termination cell C16 in the Y direction. FIG. 5 corresponds to an enlarged view of a part W2 of FIG. 6.

At the left end of the cell row CRC in the figure, the termination cells C16 and C16a are alternately arranged every other row in the Y direction. That is, the termination cells C16 and C16a are arranged adjacent to each other at the left end of the circuit block in the drawing.

In FIG. 6, the local interconnects 141 of the termination cells C16 and C16a arranged adjacent to each other in the Y direction are connected to each other, and their local interconnects 142 are connected to each other. Therefore, the termination cells arranged and aligned in the Y direction include power supply lines extending in the Y direction. That is, in the circuit block of FIG. 6, power supply lines 111 spaced from each other are connected to each other through the contacts 161 and the connected local interconnect 141. Further, the power supply lines 112 spaced from each other are connected to each other through the contact 162 and the connected local interconnect 142. Thus, the power supply of the circuit block can be strengthened without increasing the wiring structure or the wiring region in the circuit block.

Although illustration is omitted, the local interconnects 151 in the termination cells C16 and C16a and the local interconnects 152 are connected to each other. Therefore, the power supply line extending in the Y direction is also formed in the upper portion of the termination cell. That is, the power supply lines 111 spaced from each other are connected to each other through the contacts 161 and 163 and the connected local interconnect 151. Further, the power supply lines 112 spaced from each other are connected to each other through the contacts 162 and 164 and the connected local interconnect 152. Thus, the power supply of the circuit block can be strengthened without increasing the wiring structure or the wiring region in the circuit block.

Second Embodiment

FIG. 7 is a plan view showing a layout configuration of a standard cell according to a second embodiment. An illustration (a) of FIG. 7 shows a lower part of the cell, and an illustration (b) of FIG. 7 shows an upper part of the cell. As shown in FIG. 7, a termination cell C21 is arranged adjacent to the left side of the inverter cell C1 in the figure. Further, the termination cell C21 is arranged at the left end of the cell row CRC in the figure, instead of the termination cell C11 in FIG. 1.

As shown in the illustration (a) of FIG. 7, at both ends of the termination cell C21 relative to the Y direction, power supply lines 211 and 212 extending in the X direction are provided. The power supply lines 211 and 212 are both buried power rails (BPR) formed in a buried wiring layer. The power supply line 211 supplies the same power supply voltage VDD as the power supply wiring 11. The power supply line 212 supplies the same power supply voltage VSS as the power supply line 12.

A nanowire 221 extending in the X direction is formed in the lower portion of the cell, and a nanowire 226 extending in the X direction is formed in the upper portion of the cell. The nanowires 221 and 226 overlap each other in plan view. At both ends of the nanowire 221, dummy pads 223a and 223b doped with a P-type semiconductor are formed. At both ends of the nanowire 226, dummy pads 228a and 228b doped with an N-type semiconductor are formed. The nanowire 221 constitutes a channel portion of a P-type dummy transistor P21, and the dummy pads 223a and 223b constitute terminals serving as a source or a drain of the P-type dummy transistor P21. The nanowire 226 constitutes a channel portion of an N-type dummy transistor N21, and the dummy pads 228a and 228b constitute terminals serving as a source or a drain of the N-type dummy transistor N21. The N-type dummy transistor N21 is formed at a position higher than the P-type dummy transistor P21 relative to the Z direction.

At both ends of the cell relative to the X direction, dummy gate lines 231 and 234 are formed so as to extend in the Z direction from the upper portion to the lower portion of the cell and extend in the Y direction. Between the dummy gate lines 231 and 234, dummy gate lines 232 and 233 are formed which extend in the Z direction and Y direction similarly to the dummy gate lines 231 and 234. The dummy gate line arranged at the boundary between the inverter cell C1 and the termination cell C21 corresponds to the dummy gate line 35a of the inverter cell C1 and the dummy gate line 231 of the termination cell C21.

Further, the dummy gate line 232 serves as a gate of the P-type dummy transistor P21 and the N-type dummy transistor N21. That is, the nanowire 221, the dummy gate line 232, and the dummy pads 223a and 223b constitute the P-type dummy transistor P21. The nanowire 226, the dummy gate line 232, and the dummy pads 228a and 228b constitute the N-type dummy transistor N21.

In the lower portion of the cell, local interconnects 241 and 242 extending in the Y direction are formed. The local interconnects 241 and 242 are connected to the dummy pads 223a and 223b, respectively. Local interconnects 251 and 252 extending in the Y direction are formed in the upper portion of the cell. The local interconnects 251 and 252 are connected to the dummy pads 228a and 228b, respectively. Each of the local interconnects 241, 242, 251, and 252 extends to a position overlapping the power supply lines 211 and 212 in plan view. The local interconnects 241 and 242 respectively overlap the local interconnects 251 and 252 in plan view.

The dummy gate lines 231 to 234 and the local interconnects 241, 242, 251, and 252 are not connected to other wiring.

As described above, the termination cell C21 includes the P-type dummy transistor P21 and the N-type dummy transistor N21. That is, the termination cell C21 is a standard cell having no logic function.

As shown in FIG. 7, the nanowires 221 and 226 are arranged at the same position as the nanowires 21 and 26 relative to the Y direction, and arranged in the same layer in the Z direction. That is, the P-type dummy transistor P21 and the N-type dummy transistor N21 are arranged and aligned with the P-type transistor P1 and the N-type transistor N1 in the X direction, and are arranged in the same layer in the Z direction.

The gate line 31 and the dummy gate lines 35a (231), 35b, and 232 to 234 have the same width Wg relative to the X direction and the same length Lg relative to the Y direction. Further, the gate line 31 and the dummy gate lines 35a (231), 35b, and 232 to 234 are arranged in the same layer in the Z direction, and arranged at the same pitch Pg in the X direction.

The local interconnects 41, 42, 241, and 242 are arranged at the same pitch P1 in the X direction and are arranged in the same layer in the Z direction. Further, the local interconnects 51, 52, 251, and 252 are arranged at the same pitch P1 in the X direction, and are arranged in the same layer in the Z direction.

Further, the local interconnects 241, 242, 251, and 252 are arranged such that their upper ends relative to the Y direction of the figure are at the same position as the upper end of the local interconnects 41, 42, and 52 relative to the Y direction of the figure. Further, the local interconnects 241, 242, 251, and 252 are arranged such that their lower ends relative to the Y direction of the figure are at the same position as the lower end of the local interconnect 51 relative to the Y direction of the figure.

According to the above configuration, the cell row CRC includes the inverter cell C1 having a logic function and the termination cell C21 having no logic function. The termination cell C21 is arranged at the left end of the cell row CRC. The dummy gate lines 231 to 234 in the termination cell C21 are arranged in the Z direction in the same layer as the gate line 31 in the inverter cell C1. The local interconnects 241 and 242 in the termination cell C21 are arranged in the Z direction in the same layer as the local interconnects 41 and 42 in the inverter cell C1. The local interconnects 251 and 252 in the termination cell C21 are arranged in the Z direction in the same layer as the local interconnects 51 and 52 in the inverter cell C1. That is, with the dummy gate lines and the local interconnects in the termination cell, the gate lines including the dummy gate lines and the local interconnects are regularly arranged. This suppresses variations in the finished shape of the layout pattern of the cells arranged inward of a circuit block from the termination cell, suppresses manufacturing variations of the semiconductor integrated circuit devices, thus improving the yield and the reliability of the semiconductor integrated circuit devices.

The dummy gate lines 231 to 234 have the same lengths Lg as those of the gate line 31 and the dummy gate lines 35a (231) and 35b relative to the Y direction. As a result, variations in the finished shape of the layout pattern can be suppressed, and manufacturing variations in the semiconductor integrated circuit device can be suppressed.

Further, the local interconnects 241, 242, 251, and 252 are arranged such that their upper ends relative to the Y direction of the figure are at the same position as the upper end of the local interconnects 41, 42, and 52 relative to the Y direction of the figure. Further, the local interconnects 241, 242, 251, and 252 are arranged such that their lower ends relative to the Y direction of the figure are at the same position as the lower end of the local interconnect 51 relative to the Y direction of the figure. The upper ends, relative to the Y direction, of the local interconnects (i.e., the ends on the upper side of the figure) in the termination cells are aligned with the upper ends, relative to the Y direction, of the local interconnects (the ends on the upper side of the figure) which are arranged in a cell constituting the logic unit LC and which are most distant from the transistors. Further, the lower ends, relative to the Y direction, of the local interconnects (i.e., the ends on the lower side of the figure) in the termination cells are aligned with the lower ends, relative to the Y direction, of the local interconnects (the ends on the lower side of the figure) which are arranged in a cell constituting the logic unit LC and which are most distant from the transistors. This makes the distance between the logic unit LC and the closest local interconnect constant, so that the performance predictability of the cells arranged in the logic unit LC can be improved.

Further, the termination cell C21 includes the P-type dummy transistor P21 and the N-type dummy transistor N21. The P-type dummy transistor P21 and the N-type dummy transistor N21 are arranged in the Z direction in the same layer as the P-type transistor P1 and the N-type transistor N1 of the inverter cell C1. As a result, variations in the finished shape of the layout pattern and manufacturing variations can also be suppressed for the transistors.

Further, the P-type dummy transistor P21 and the N-type dummy transistor N21 are arranged near the dummy gate line 35a (231) at the boundary between the termination cell C21 and the inverter cell C1. That is, with the P-type dummy transistor and N-type dummy transistor in the termination cell, the distance between a cell arranged at an end of the logic unit and the closest transistor constant, so that the performance predictability of the logic unit can be improved.

It should be noted that, while the above description deals with a case where the termination cell C21 includes one P-type dummy transistor and one N-type dummy transistor (the P-type dummy transistor P21 and the N-type dummy transistor N21), the number of the P-type transistors and the number of the N-type transistors are not limited to this. However, the number of P-type dummy transistors and the number of N-type dummy transistors arranged in the termination cell are numbers required for suppressing manufacturing variation of the circuit blocks.

Further, the termination cell C21 is arranged instead of the termination cell C11 in FIG. 1. Further, inversions of the termination cell C21 in the X direction, the Y direction, and the X direction and the Y direction may be arranged, instead of the termination cells C11a, C11b, C11c, respectively.

(Variation of Termination Cells)

Figure 8:
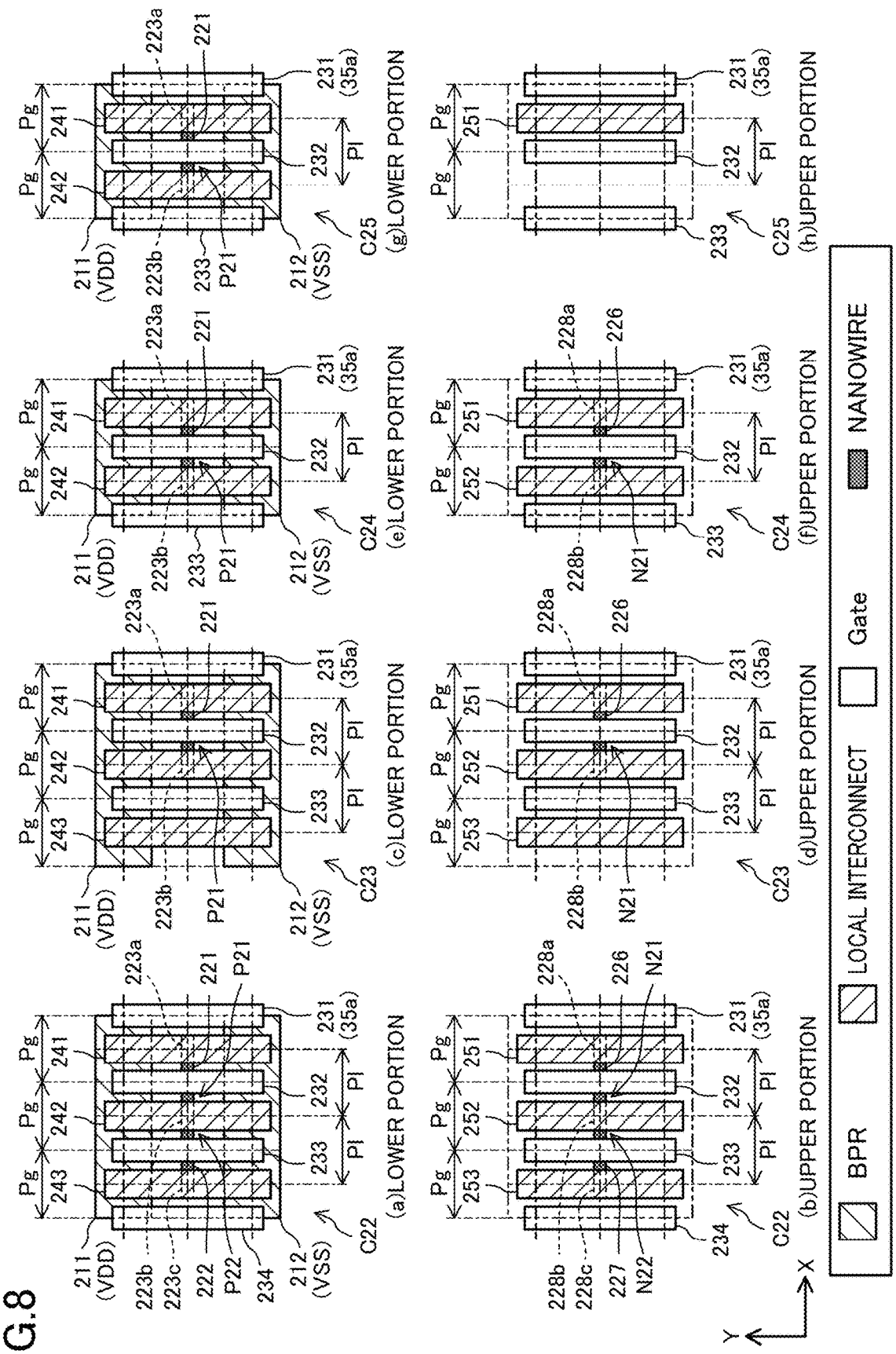
FIG. 8 includes illustrations (a) to (h) each showing a plan view of a variation of the termination cell according to the second embodiment.

FIG. 8 and FIG. 7 are each a plan view showing variations of the termination cells according to the present embodiment. Specifically, illustrations (a) and (b) of FIG. 8 each show a termination cell C22, illustrations (c) and (d) of FIG. 8 each show a termination cell C23, illustrations (e) and (f) of FIG. 8 each show a termination cell C24, and illustrations (g) and (h) of FIG. 8 each show a termination cell C25. The illustrations (a), (c), (e), and (g) of FIG. 8 show the lower part of each termination cell, and the illustrations (b), (d), (f), and (h) of FIG. 8 each show the upper part of each termination cell.

As shown in the illustrations (a) and (b) of FIG. 8, the termination cell C22 has three local interconnects and two nanowires in each of the upper and the lower portions thereof.

Specifically, a nanowire 222 extending in the X direction is formed in the lower portion of the cell, and a nanowire 227 extending in the X direction is formed in the upper portion of the cell. The nanowires 222 and 227 overlap each other in plan view. Further, the nanowires 222 and 227 are arranged at the same position as the nanowires 221 and 226 in the Y direction, and arranged in the same layer in the Z direction.

On the left side of the nanowire 222 in the figure, a dummy pad 223c doped with a P-type semiconductor is formed. On the right side of the nanowire 222 in the figure, a dummy pad 223b is formed. On the left side of the nanowire 227 in the figure, a dummy pad 228c doped with an N-type semiconductor is formed. On the right side of the nanowire 227 in the figure, a dummy pad 228b is formed. The nanowire 222 constitutes a channel portion of a P-type dummy transistor P22, and the dummy pads 223b and 223c constitute terminals serving as a source or a drain of the P-type dummy transistor P22. The nanowire 227 constitutes a channel portion of an N-type dummy transistor N22, and the dummy pads 228b and 228c constitute terminals serving as a source or a drain of the N-type dummy transistor N22. The N-type dummy transistor N22 is formed at a position higher than the P-type dummy transistor P22 relative to the Z direction.

Further, the dummy gate line 233 serves as a gate of the P-type dummy transistor P22 and the N-type dummy transistor N22. That is, the nanowire 222, the dummy gate line 233, and the dummy pads 223b and 223c constitute the P-type dummy transistor P22. The nanowire 227, the dummy gate line 233, and the dummy pads 228b and 228c constitute the N-type dummy transistor N22.

In the lower portion of the cell, a local interconnect 243 extending in the Y direction is formed. The local interconnect 243 is connected to the dummy pad 223c. A local interconnect 253 extending in the Y direction is formed in the upper portion of the cell. The local interconnect 253 is connected to the dummy pad 228c. Each of the local interconnects 243 and 253 extends to a position overlapping the power supply lines 211 and 212 in plan view. The local interconnects 243 and 253 respectively overlap each other in plan view.

Further, the local interconnects 241, 242, and 243 are arranged at the same pitch P1 in the X direction, and are arranged in the same layer in the Z direction. The upper and lower ends of the local interconnects 241, 242, and 243 relative to the Y direction are arranged at the same position.

The local interconnects 251, 252, and 253 are arranged at the same pitch P1 in the X direction, and are arranged in the same layer in the Z direction. The upper and lower ends of the local interconnects 251, 252, and 253 relative to the Y direction are arranged at the same position.

As shown in the illustrations (c) and (d) of FIG. 8, local interconnects 243 and 253 are respectively formed in the upper and lower portions of the termination cell C23, and a dummy gate line 234 is formed on the left end of the termination cell C23 relative to the X direction.

As shown in the illustrations (e) and (f) of FIG. 8, the cell width of the termination cell C24 is shorter than that of the termination cell C21 (2×Pg). The dummy gate line 234 is not provided in the termination cell C24.

As shown in the illustrations (g) and (h) of FIG. 8, the termination cell C25 is configured substantially similarly to the termination cell C24, but the nanowire 226, the dummy pads 228a and 228b and the local interconnect 252 is not provided.

The termination cells C22 to C25 each brings about a similar effect brought about by the termination cell C21.

(Variation of Termination Cell)

FIG. 9 and FIG. 7 are each a plan view showing another layout configuration of the termination cell. An illustration (a) of FIG. 9 shows a lower part of the cell, and an illustration (b) of FIG. 9 shows an upper part of the cell. In the termination cell C26, a contact is formed, and a line is formed in an M1 wiring layer.

Specifically, in the lower portion of the cell, local interconnect 244 extending in the Y direction is formed. The local interconnect 244 is connected to the dummy pad 223b. The local interconnect 244 overlaps the power supply line 211 in plan view, but does not overlap the power supply line 212.

A local interconnect 254 extending in the Y direction is formed in the upper portion of the cell. The local interconnect 254 is connected to the dummy pad 228a. The local interconnect 254 overlaps the power supply line 212 in plan view, but does not overlap the power supply line 211.

Further, in the termination cell C26, contacts 261 to 263, 281, and 282 are formed. The contacts 261, 262, and 281 overlap the power supply line 211 in plan view. The contacts 263 and 282 overlap the power supply line 212 in plan view.

The local interconnect 241 is connected to the power supply line 211 through the contact 261. The local interconnect 244 is connected to the power supply line 211 through the contact 262. The local interconnect 252 is connected to the power supply line 212 through the contact 263. The local interconnect 254 is not directly connected to any of the power supply lines 211 and 212.

In the M1 wiring layer, lines 271 and 272 each extending in the X direction are formed. The line 271 is connected to the local interconnect 241 through the contact 281. The line 272 is connected to the local interconnect 252 through the contact 282. The line 271 overlaps the local interconnect 241 and the contacts 261 and 281 in plan view. The line 272 overlaps the local interconnect 252 and the contact 263 in plan view.

The termination cell C26 brings about a similar effect brought about by the termination cell C21.

Further, to the dummy pad 223a, a power source potential VDD is supplied from the power supply line 211 through the local interconnect 241 and the contact 261. Further, to the dummy pad 223b, the power source potential VDD is supplied from the power supply line 211 through the local interconnect 244 and the contact 262. That is, the same power source potential VDD is supplied to the source and the drain of the P-type dummy transistor P21. This way, it is possible to avoid different power source potentials from being supplied to the source and the drain of the P-type dummy transistor, and avoid short-circuiting with the power source.

Further, to the dummy pad 228b, a power source potential VSS is supplied from the power supply line 212 through the local interconnect 252 and the contact 263. The dummy pad 228a does not receive a power source potential from any of the power supply lines 211 and 212. That is, in the N-type dummy transistor N21, the power source potential VSS is supplied to one of the source and the drain, and is not supplied to the other one of the source and the drain, so that the N-type dummy transistor N21 is in a floating state. This way, it is possible to avoid different power source potentials from being supplied to the source and the drain of the N-type dummy transistor, and avoid short-circuiting with the power source.

Further, in the termination cell C26, lines 271 and 272 are formed in the M1 wiring layer. From the upper layers including the M1 wiring layer, the power source potential VDD can be supplied to the buried wiring layer through the line 271, the local interconnect 241, and the contacts 281 and 261. Further, from the upper layers including the M1 wiring layer, the power source potential VSS can be supplied to the buried wiring layer through the line 272, the local interconnect 252, and the contacts 282 and 263. This strengthens the power source for the buried wiring layer.

It should be noted that the above description deals with a case where the dummy gate line 232 is not connected to the other line, the present disclosure is not limited to this. The dummy gate line 232 may be connected to, via a contact, the power supply line 211 or the power supply line 212 and fix to the power source potential VSS or the power source potential VDD. Fixing the dummy gate line 232 to the power source potential VSS turns on the P-type dummy transistor P21, and the P-type dummy transistor P21 can serve as a capacity. Further, fixing the dummy gate line 232 to the power source potential VDD turns on the N-type dummy transistor N21, and the P-type dummy transistor P21 can serve as a capacity.

Further, although the above description deals with a case where the power source potential VDD is supplied to the dummy pads 223a and 223b, and the power source potential VSS is supplied to the dummy pad 228b, the present disclosure is not limited to this. For example, contacts may be formed in the termination cell C26 so that the power source potential VSS is supplied to the dummy pads 223a and 223b and the power source potential VDD is supplied to the dummy pad 228b.

Third Embodiment

FIG. 10 is an enlarged view of a part W3 in FIG. 1, and is a plan view showing a layout configuration of the standard cell in this embodiment. An illustration (a) of FIG. 10 shows a lower part of the cell, and an illustration (b) of FIG. 10 shows an upper part of the cell.

As shown in FIG. 1, a termination cell C31 is arranged in the cell row CRT at the uppermost of the circuit block relative to the Y direction. Further, the termination cell C31 is arranged adjacent to the upper side, in the figure, of the inverter cell C1 arranged at the upper end of a logic unit LC in the figure.

As shown in the illustration (a) of FIG. 10, at both ends of the termination cell C31 relative to the Y direction, power supply lines 311 and 312 extending in the X direction are provided. The power supply lines 311 and 312 are both buried power rails (BPR) formed in a buried wiring layer. The power supply line 311 supplies the same power supply voltage VDD as the power supply wiring 11. The power supply line 312 supplies the same power supply voltage VSS as the power supply line 12.

Nanowires 321 and 322 extending in the X direction are formed in the lower portion of the cell, and nanowires 326 and 327 extending in the X direction are formed in the upper portion of the cell. The nanowires 321 and 322 respectively overlap the nanowires 326 and 327 in plan view. Further, the nanowires 321 and 322 are arranged at the same position relative to the Y direction, and arranged in the same layer in the Z direction. The nanowires 326 and 327 are arranged at the same position relative to the Y direction, and arranged in the same layer in the Z direction.

On the left side of the nanowire 321 in the figure, a dummy pad 323a doped with a P-type semiconductor is formed. Between the nanowires 321 and 322, a dummy pad 323b doped with a P-type semiconductor is formed. On the right side of the nanowire 322 in the figure, a dummy pad 323c doped with a P-type semiconductor is formed. On the left side of the nanowire 326 in the figure, a dummy pad 328a doped with an N-type semiconductor is formed. Between the nanowires 326 and 327, a dummy pad 328b doped with an N-type semiconductor is formed. On the right side of the nanowire 327 in the figure, a dummy pad 328c doped with an N-type semiconductor is formed. The nanowire 321 constitutes a channel portion of a P-type dummy transistor P31, and the dummy pads 323a and 323b constitute terminals serving as a source or a drain of the P-type dummy transistor P31. The nanowire 322 constitutes a channel portion of a P-type dummy transistor P32, and the dummy pads 323b and 323c constitute terminals serving as a source or a drain of the P-type dummy transistor P32. The nanowire 326 constitutes a channel portion of an N-type dummy transistor N31, and the dummy pads 328a and 328b constitute terminals serving as a source or a drain of the N-type dummy transistor N31. The nanowire 327 constitutes a channel portion of an N-type dummy transistor N32, and the dummy pads 328b and 328c constitute terminals serving as a source or a drain of the N-type dummy transistor N32. The N-type dummy transistors N31 and N32 are formed at positions higher than the P-type dummy transistors P31 and P32 relative to the Z direction, respectively.

At both ends of the cell relative to the X direction, dummy gate lines 331 and 334 are formed so as to extend in the Z direction from the upper portion to the lower portion of the cell and extend in the Y direction. Between the dummy gate lines 331 and 334, dummy gate lines 332 and 333 are formed which extend in the Z direction and Y direction similarly to the dummy gate lines 331 and 334. The dummy gate lines 331 to 334 are arranged at the same pitch Pg in the X direction.

Further, the dummy gate line 332 serves as a gate of the P-type dummy transistor P31 and the N-type dummy transistor N31. That is, the nanowire 321, the dummy gate line 332, and the dummy pads 323a and 323b constitute the P-type dummy transistor P31. The nanowire 326, the dummy gate line 332, and the dummy pads 328a and 328b constitute the N-type dummy transistor N31. Further, the dummy gate line 333 serves as a gate of the P-type dummy transistor P32 and the N-type dummy transistor N32. That is, the nanowire 322, the dummy gate line 333, and the dummy pads 323b and 323c constitute the P-type dummy transistor P32. The nanowire 327, the dummy gate line 333, and the dummy pads 328b and 328c constitute the N-type dummy transistor N32.

In the lower portion of the cell, local interconnects 341, 342, and 343 extending in the Y direction are formed. The local interconnects 341, 342, and 343 are connected to the dummy pads 323a, 323b, and 323c, respectively. Local interconnects 351, 352, and 353 extending in the Y direction are formed in the upper portion of the cell. The local interconnects 351, 352, and 353 are connected to the dummy pads 328a, 328b, and 328c, respectively.

Each of the local interconnects 341 to 343, and 351 to 353 extends to a position overlapping the power supply lines 311 and 312 in plan view. The local interconnects 341, 342, and 343 respectively overlap the local interconnects 351, 352, and 353 in plan view.

The local interconnects 341, 342, and 343 are arranged at the same pitch P1 in the X direction and are arranged in the same layer in the Z direction. The local interconnects 351, 352, and 353 are arranged at the same pitch P1 in the X direction and are arranged in the same layer in the Z direction.

The upper and lower ends of the local interconnects 341, 342, and 343 relative to the Y direction of the figure are arranged at the same position. The upper and lower ends of the local interconnects 351, 352, and 353 relative to the Y direction of the figure are arranged at the same position.

The dummy gate lines 331 to 334 and the local interconnects 341 to 343, and 351 to 353 are not connected to other wiring.

As described above, the termination cell C31 includes the P-type dummy transistors P31 and P32 and the N-type dummy transistors N31 and N32. That is, the termination cell C31 is a standard cell having no logic function.

As shown in the illustration (a) of FIG. 10, the nanowires 21 and 321 are arranged at the same position relative to the X direction. Further, the nanowires 21, 321, and 322 are arranged in the same layer in the Z direction. The P-type transistor P1 and the P-type dummy transistors P31 and P32 are arranged in the Z direction in the same layer. Further, the P-type transistor P1 and the P-type dummy transistor P31 are arranged and aligned in the Y direction.

As shown in the illustration (b) of FIG. 10, the nanowires 26 and 326 are arranged at the same position relative to the X direction. Further, the nanowires 26, 326, and 327 are arranged in the same layer in the Z direction. The N-type transistor N1 and the N-type dummy transistors N31 and N32 are arranged in the Z direction in the same layer. Further, the N-type transistor N1 and the N-type dummy transistor N31 are arranged and aligned in the Y direction.

The gate line 31 and the dummy gate lines 35a, 35b, and 331 to 334 have the same width Wg relative to the X direction and the same length Lg relative to the Y direction. Further, the gate line 31 and the dummy gate lines 35a, 35b, and 331 to 334 are arranged in the same layer in the Z direction. Further, the dummy gate lines 331, 332, and 333 are arranged at the same positions relative to the X direction as the dummy gate line 35a, the gate line 31, and the dummy gate line 35b, respectively.

Further, the local interconnects 41, 42, and 341 to 343 are arranged in the same layer in the Z direction. The local interconnects 341 and 342 are arranged at the same positions relative to the X direction as the local interconnects 41 and 42.

Further, the local interconnects 51, 52, and 351 to 353 are arranged in the same layer in the Z direction. The local interconnects 351 and 352 are arranged at the same positions relative to the X direction as the local interconnects 51 and 52.

According to the above configuration, the termination cell C31 having no logic function is arranged adjacent to the inverter cell C1 having a logic function, in the cell row CRT at the uppermost of the circuit block relative to the Y direction. The P-type dummy transistors P31 and P32 of the termination cell C31 are arranged in the same layer as the P-type transistor P1 of the inverter cell C1. The N-type dummy transistors N31 and N32 of the termination cell C31 are arranged in the same layer as the N-type transistor N1 of the inverter cell C1. The local interconnects 341 to 343 of the termination cell C31 are arranged in the same layer as the local interconnects 41 and 42 of the inverter cell C1. The local interconnects 351 to 353 of the termination cell C31 are arranged in the same layer as the local interconnects 51 and 52 of the inverter cell C1. That is, with the dummy transistors, the dummy gate lines, and the local interconnects in the termination cell, the transistors including the dummy transistors, the gate lines including the dummy gate lines, and the local interconnects are regularly arranged. This suppresses variations in the finished shape of the layout pattern of the cells arranged at positions of a circuit block inward from the termination cell, suppresses manufacturing variations of the semiconductor integrated circuit devices, thus improving the yield and the reliability of the semiconductor integrated circuit devices.

Further, the nanowires 321 and 326 are arranged at the same position relative to the X direction as the nanowires 21 and 26. Further, the dummy gate lines 331 to 333 are arranged at the same positions relative to the X direction as the dummy gate line 35a, the gate line 31, and the dummy gate line 35b, respectively. Further, the local interconnects 341, 342, 351, and 352 are arranged at the same positions relative to the X direction as the local interconnects 41, 42, 51, and 52, respectively. That is, in the termination cell C31, the dummy transistors, the dummy gate lines, and the local interconnects are formed throughout its cell width. This suppresses variations in the finished shape of the layout pattern of the cells arranged at positions of a circuit block inward from the termination cell, suppresses manufacturing variations of the semiconductor integrated circuit devices, thus improving the yield and the reliability of the semiconductor integrated circuit devices.

It should be noted that, while the cell width of the termination cell C31 is (3×Pg) in the above, the cell width is not limited to this.

Further, although the above description deals with a case where the termination cell C31 includes the P-type dummy transistors P31 and P32 and the N-type dummy transistors N31 and N32, the present disclosure is not limited to this. The P-type dummy transistors P31 and P32 and the N-type dummy transistors N31 and N32 may be partially or entirely omitted in the termination cell C31. Note, however, that forming the P-type dummy transistors P31 and P32 and the N-type dummy transistors N31 and N32 in the termination cell C31 can suppress manufacturing variation of the semiconductor integrated circuit device.

Further, as shown in FIG. 1, the termination cell C31a which is an inversion of the termination cell C31 in the Y direction is arranged in the cell row CRB at the lowermost of the circuit block relative to the Y direction.

(Variation 1 of Termination Cell)

FIG. 11 is a plan view showing another layout configuration of the termination cell. An illustration (a) of FIG. 11 shows a lower part of the cell, and an illustration (b) of FIG. 11 shows an upper part of the cell. A termination cell C32 has a smaller cell height (dimension relative to the Y direction) than the termination cell C31, and has no power supply line 312.

Specifically, the termination cell C32 has dummy gate lines 335 to 338 extending in the Y direction and Z direction, which are arranged at the same pitch Pg in the X direction. The dummy gate lines 335 and 338 are arranged on both ends of the cell relative to the X direction, respectively. Further, the dummy gate line 336 serves as a gate of the P-type dummy transistor P31 and the N-type dummy transistor N31, and the dummy gate line 337 serves as a gate of the P-type dummy transistor P32 and the N-type dummy transistor N32.

Further, the dummy gate lines 335 to 338 have the same lengths relative to the Y direction and the same widths Wg relative to the X direction. The dummy gate lines 335 to 338 have a shorter length relative to the Y direction than the lengths Lg relative to the Y direction of the dummy gate lines 331 to 334 of the termination cell C31.

In the lower portion of the cell, local interconnects 344 to 346 extending in the Y direction are formed. The local interconnects 344 to 346 are connected to the dummy pads 323a to 323c, respectively. Local interconnects 354 to 356 extending in the Y direction are formed in the upper portion of the cell. The local interconnects 354 to 356 are connected to the dummy pads 328a to 328c, respectively. The local interconnects 344 to 346, and 354 to 356 overlap the power supply line 311 in plan view.

Both ends of the local interconnects 344 to 346 in the Y direction are arranged at the same position. The local interconnects 344 to 346 each has a shorter length relative to the Y direction than the lengths, relative to the Y direction, of the local interconnects 341 to 343 of the termination cell C31.

Both ends of the local interconnects 354 to 356 relative to the Y direction are arranged at the same position. The local interconnects 354 to 356 each has a shorter length relative to the Y direction than the lengths, relative to the Y direction, of the local interconnects 351 to 353 of the termination cell C31.

The dummy gate lines 335 to 338 and the local interconnects 344 to 346, and 354 to 356 of the termination cell C32 are formed so as to have a length relative to the Y direction required to suppress manufacturing variation of the logic unit. This brings about a similar effect brought about by the termination cell C31.

Further, since the height of the termination cell C32 is smaller than that of the termination cell C31, a reduction of the area of the circuit block is possible.

It should be noted that, while the cell width of the termination cell C32 is (3×Pg) in the above, the cell width is not limited to this.

Further, although the above description deals with a case where the termination cell C32 includes the P-type dummy transistors P31 and P32 and the N-type dummy transistors N31 and N32, the present disclosure is not limited to this. The P-type dummy transistors P31 and P32 and the N-type dummy transistors N31 and N32 may be partially or entirely omitted in the termination cell C32. Note, however, that forming the P-type dummy transistors P31 and P32 and the N-type dummy transistors N31 and N32 in the termination cell C32 can suppress manufacturing variation of the semiconductor integrated circuit device.

Further, in a case of arranging the termination cell C32 in the cell row CRB at the lowermost of the circuit block relative to the Y direction, an inversion of the termination cell C32 in the Y direction may be arranged.

Further, the local interconnects, the dummy gate lines, and the power supply line may be partially omitted from the termination cell C32.

(Variation 2 of Termination Cell)

FIG. 12 is a plan view showing another layout configuration of the termination cell. An illustration (a) of FIG. 12 shows a lower part of the cell, and an illustration (b) of FIG. 12 shows an upper part of the cell. A termination cell C42 has the same height as the termination cell C32, and is arranged on the left end relative to the X direction, in the cell row CRB at the lowermost of the circuit block. That is, the termination cell C42 is arranged in the lower-left corner of the circuit block instead of the termination cell C41, in FIG. 1.

The termination cell C42 is such that the termination cell C32 is inverted in the Y direction and the P-type dummy transistor P31 and the N-type dummy transistor N31 are omitted. Specifically, the termination cell C42 does not include the nanowires 321 and 326, the dummy pads 323a and 328a, and the local interconnects 344 and 354.

Here, it is supposed that the termination cell C42 is arranged in the lower-left corner of the circuit block, an inversion of the termination cell C32 in the Y direction is arranged on the right side of the termination cell C42 in the figure, an inversion of the termination cell C21 in the Y direction is arranged on the upper side of the termination cell C42 in the figure. In this case, the termination cell C42 is arranged in the lower-left corner of the circuit block instead of the termination cell C41, in FIG. 1. Further, an inversion of the termination cell C32 in the Y direction is arranged in the cell row CRB at the lowermost of the circuit block relative to the Y direction, instead of the termination cell C31a. Further, an inversion of the termination cell C21 in the Y direction is arranged on the left end of the cell row CRC in the figure, instead of the termination cell C11a. The dummy gate line arranged at the boundary between the termination cell C42 and the termination cell C32 corresponds to the dummy gate line 335 of the termination cell C32 and the dummy gate line 338 of the termination cell C42.

According to the above configuration, the termination cell C42 having no logic function is arranged in a corner of the circuit block. That is, the termination cell C42 is arranged adjacent, relative to the X direction, to the termination cell C32 having no logic function, at the left end of the cell row CRB at the lowermost of the cell block relative to the Y direction. Further, the termination cell C42 is arranged adjacent, relative to the Y direction, to the termination cell C21 arranged on the left end of the cell row CRC. The P-type dummy transistor P32 of the termination cell C42 is arranged in the Z direction in the same layer as the P-type dummy transistor P21 of the termination cell C21 and the P-type dummy transistors P31 and P32 of the termination cell C32. The N-type dummy transistor N32 of the termination cell C42 is arranged in the Z direction in the same layer as the N-type dummy transistor N21 of the termination cell C21 and the N-type dummy transistors N31 and N32 of the termination cell C32. That is, with the dummy transistors, the dummy gate lines, and the local interconnects in the termination cell, the transistors including the dummy transistors, the gate lines including the dummy gate lines, and the local interconnects are regularly arranged. This suppresses variations in the finished shape of the layout pattern of the cells arranged at positions of a circuit block inward from the termination cell, suppresses manufacturing variations of the semiconductor integrated circuit devices, thus improving the yield and the reliability of the semiconductor integrated circuit devices.

It should be noted that each embodiment and variation described hereinabove deals with a case where each transistor includes one nanowire in the upper and lower portions of the cell; however, a part of or all of the transistors may include a plurality of nanowires. In such a case, a plurality of nanowires may be arranged in the Y direction or in the Z direction in plan view. Further, a plurality of nanowires may be arranged in the Y direction and in the Z direction. Further, the numbers of nanowires the transistor has in the upper and lower portions of the cell may be different.

Further, the above-described embodiment described the nanowire FET as an exemplary three-dimensional transistor. However, the three-dimensional transistor is not limited to this. For example, the transistor formed in the lower portion of each termination cell may be a fin-type transistor.

Further, the inverter cell C1 and each termination cell include P-type transistors including the P-type dummy transistors in their lower portions, and N-type transistors including the N-type dummy transistors in their upper portions. However, the present disclosure is not limited to this, and P-type transistors may be formed in the cell upper portions, and the N-type transistors may be formed in the lower portions.

Further, the power supply line in each termination cell is a buried line; however, the power supply line is not limited to this. For example, the power supply line of each termination cell may be wired in the M1 wiring layer.

Further, the termination cells arranged in corners of the circuit block are not limited to the termination cells C41 and C42. Any of the above-described termination cells may be arranged at a corner of the circuit block.

Further, the circuit block has a rectangular shape in FIG. 1; however, the shape of the circuit block is not limited to this. Further, in each of FIG. 1 and FIG. 6, six cell rows are arranged in the circuit block. However, the number of cell rows in the cell block is not limited to this.

The present disclosure that enables application of a standard cell using a CFET to a semiconductor integrated circuit device suppresses manufacturing variations of the semiconductor integrated circuit devices, thus improving the yield and the reliability of the semiconductor integrated circuit devices.

What is claimed is:

1. A semiconductor integrated circuit device, comprising:
    a plurality of cell rows each including a plurality of standard cells aligned in a first direction, wherein
    a first cell row which is one of the plurality of cell rows includes a first standard cell having a logic function and a second standard cell having no logic function, the second standard cell being arranged at one or each end of the first cell row, wherein
    the first standard cell includes
        a first power supply line that extends in the first direction and is configured to supply a first power supply voltage,
        a second power supply line that extends in the first direction and is configured to supply a second power supply voltage different from the first power supply voltage,
        a first transistor that is a three-dimensional transistor of a first conductive type,
        a second transistor that is a three-dimensional transistor of a second conductive type, which is formed at a position higher than the first transistor relative to a depth direction,
        a gate line extending in a second direction perpendicular to the first direction and in the depth direction, which serves as a gate of each of the first transistor and the second transistor,
        a first local interconnect and a second local interconnect extending in the second direction and connected to a source and a drain of the first transistor, respectively, and
        a third local interconnect and a fourth local interconnect extending in the second direction and connected to a source and a drain of the second transistor, respectively;
    wherein
    the second standard cell includes
        a third power supply line that extends in the first direction and is configured to supply the first power supply voltage,
        a fourth power supply line that extends in the first direction and is configured to supply the second power supply voltage,
        a first dummy transistor that is a three-dimensional transistor of the first conductive type, which is arranged in the depth direction in a same layer as the first transistor,
        a second dummy transistor that is a three-dimensional transistor of the second conductive type, which is arranged in the depth direction in a same layer as the second transistor,
        a dummy gate line extending in the second direction and the depth direction and arranged in the depth direction in a same layer as the gate line, the dummy gate line configured to serve as a gate of each of the first dummy transistor and the second dummy transistor,
        a fifth local interconnect extending in the second direction, and arranged in the depth direction in a same layer as the first local interconnect and the second local interconnect, the fifth local interconnect connected to one of a source or a drain of the first dummy transistor, and
        a sixth local interconnect extending in the second direction, and arranged in the depth direction in a same layer as the third local interconnect and the fourth local interconnect, the fifth local interconnect connected to one of a source or a drain of the second dummy transistor; and wherein
    the sixth local interconnect overlaps the fifth local interconnect in plan view.

2. The semiconductor integrated circuit device of claim 1, wherein
    a channel portion of the first dummy transistor is arranged in the second direction at a same position as a channel portion of the first transistor, and
    a channel portion of the second dummy transistor is arranged in the second direction at a same position as a channel portion of the second transistor.

3. The semiconductor integrated circuit device of claim 1, wherein
    the fifth local interconnect is connected to the third power supply line.

4. The semiconductor integrated circuit device of claim 1, wherein
    the second power supply voltage is supplied to the dummy gate line.

5. The semiconductor integrated circuit device of claim 1, wherein
    the second standard cell includes
        a first line arranged in a position higher than the sixth local interconnect relative to the depth direction, and overlapping the fifth local interconnect in plan view, the first line being connected to the fifth local interconnect through a contact.

* * * * *